United States Patent
Ohmori et al.

(10) Patent No.: US 11,114,300 B2
(45) Date of Patent: Sep. 7, 2021

(54) LASER ANNEALING APPARATUS, INSPECTION METHOD OF SUBSTRATE WITH CRYSTALLIZED FILM, AND MANUFACTURING METHOD OF SEMICONDUCTOR DEVICE

(71) Applicant: THE JAPAN STEEL WORKS, LTD., Tokyo (JP)

(72) Inventors: Kenichi Ohmori, Yokohama (JP); Suk-Hwan Chung, Yokohama (JP); Ryosuke Sato, Yokohama (JP); Masashi Machida, Yokohama (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 197 days.

(21) Appl. No.: 16/320,455

(22) PCT Filed: Jul. 14, 2017

(86) PCT No.: PCT/JP2017/025652
§ 371 (c)(1),
(2) Date: Jan. 24, 2019

(87) PCT Pub. No.: WO2018/037756
PCT Pub. Date: Mar. 1, 2018

(65) Prior Publication Data
US 2019/0267240 A1 Aug. 29, 2019

(30) Foreign Application Priority Data
Aug. 24, 2016 (JP) .............................. JP2016-163693
Jun. 7, 2017 (JP) .............................. JP2017-112516

(51) Int. Cl.
*H01L 21/20* (2006.01)
*H01L 21/02* (2006.01)
(Continued)

(52) U.S. Cl.
CPC .... *H01L 21/2011* (2013.01); *H01L 21/02675* (2013.01); *H01L 21/268* (2013.01); *H01L 29/78663* (2013.01)

(58) Field of Classification Search
CPC ............. H01L 21/02675; H01L 21/268; H01L 21/02691; H01L 27/1285; H01L 21/2011;
(Continued)

(56) References Cited

U.S. PATENT DOCUMENTS

2009/0298208 A1* 12/2009 Amago .............. G01N 21/8422
438/16

FOREIGN PATENT DOCUMENTS

| JP | H03-097219 A | 4/1991 |
| JP | H10-144621 A | 5/1998 |

(Continued)

OTHER PUBLICATIONS

International Search Report from International Patent Application No. PCT/JP2017/025652, dated Oct. 3, 2017.

*Primary Examiner* — Selim U Ahmed
(74) *Attorney, Agent, or Firm* — SGPatents PLLC

(57) ABSTRACT

A laser annealing apparatus (1) according to the embodiment includes: a laser beam source (11) configured to emit a laser beam (L1) to crystallize an amorphous silicon film (101a) on a substrate (100) and to form a poly-silicon film (101b); a projection lens (13) configured to condense the laser beam to irradiate a silicon film (101); a probe beam source configured to emit a probe beam (L2); a photodetector (25) configured to detect the probe beam (L3) transmitted through the silicon film (101); a processing apparatus (26) configured to calculate a standard deviation of detection values of a detection signal output from the photodetector, and to determine a crystalline state of the crystallized film based on the standard deviation.

9 Claims, 28 Drawing Sheets

(51) Int. Cl.
*H01L 29/786* (2006.01)
*H01L 21/268* (2006.01)

(58) Field of Classification Search
CPC ... H01L 29/78663; H01L 22/20; H01L 22/12; H01L 21/02532; B23K 26/705; B23K 31/125; B23K 26/032
See application file for complete search history.

(56) References Cited

FOREIGN PATENT DOCUMENTS

| | | |
|---|---|---|
| JP | H11-121378 A | 4/1999 |
| JP | 2916452 B1 | 7/1999 |
| JP | 2001-332476 A | 11/2001 |
| JP | 2002-009012 A | 1/2002 |
| JP | 2008-028303 A | 2/2008 |
| JP | 2009-065146 A | 3/2009 |

\* cited by examiner

LASER ANNEALING APPARATUS, INSPECTION METHOD OF SUBSTRATE WITH CRYSTALLIZED FILM, AND MANUFACTURING METHOD OF SEMICONDUCTOR DEVICE

TECHNICAL FIELD

The present disclosure relates to a laser annealing apparatus, an inspection method of a substrate with crystalized film and a manufacturing method of a semiconductor device.

BACKGROUND ART

Patent Literature 1 discloses a laser annealing apparatus for forming a polysilicon thin film. The laser annealing apparatus in Patent Literature 1 irradiates a polysilicon thin film with evaluating light to evaluate the crystalline state of the polysilicon thin film. Then, the laser annealing apparatus detects the irradiation light transmitted through the polysilicon thin film. The crystalline state is evaluated based on the ratio of the transmission intensity of the irradiation light to the light intensity of reference light which is emitted from the same light source and is not transmitted through the polysilicon thin film.

CITATION LIST

Patent Literature

Patent Literature 1: Japanese Patent No. 2916452

SUMMARY OF INVENTION

Technical Problem

However, the laser annealing apparatus in Patent Literature 1 cannot properly evaluate a crystalline state.

Other problems and novel features will be clarified from the description of this specification and the attached drawings.

Solution to Problem

According to an embodiment, an inspection method of a substrate with a crystalized film, the method includes the steps of: (C) detecting, by a photodetector, the probe beam transmitted through the crystallized film; (D) changing an irradiation position of the probe beam on the crystallized film to acquire a plurality of detection values of a detection signal from the photodetector; and (E) determining, based on a standard deviation of the plurality of detection values, a crystalline state of the crystallized film.

According to an embodiment, manufacturing method of a semiconductor device, the method includes the steps of: (b) irradiating the amorphous film with a laser beam to crystallize the amorphous film and to form a crystallized film; (c) irradiating the crystallized film with a probe beam; (d) detecting, by a photodetector, the probe beam transmitted through the crystallized film; (e) changing an irradiation position of the probe beam on the crystallized film to acquire a plurality of detection values of a detection signal output from the photodetector; and (f) determining, based on a standard deviation of the plurality of detection values, a crystalline state of the crystallized film.

According to an embodiment, a laser annealing apparatus includes: a laser beam source configured to emit a laser beam to crystallize an amorphous film over a substrate and to form a crystallized film; a probe beam source configured to emit a probe beam; a photodetector configured to detect the probe beam transmitted through the crystallized film; and a processing unit configured to change an irradiation position of the probe beam on the substrate, to calculate a standard deviation of detection values of a detection signal output from the photodetector, and to determine a crystalline state of the crystallized film based on the standard deviation.

According to an embodiment, a laser annealing apparatus includes: a stage configured to convey the substrate; a probe beam source configured to emit a probe beam that enters the substrate outside of the stage; and a photodetector configured to detect the probe beam transmitted through the crystallized film outside the stage during a conveying robot takes out the substrate from the stage.

Advantageous Effects of Invention

According to the embodiment, it is possible to properly evaluate the crystalline state of a crystallized film.

DESCRIPTION OF EMBODIMENTS

First Embodiment

A laser annealing apparatus according to the present embodiment is, for example, an excimer laser anneal (ELA) apparatus that forms low temperature poly-silicon (LTPS) films. Hereinafter, a laser annealing apparatus, and an inspection method and a manufacturing method of a semiconductor device according to the present embodiment are described with reference to the drawings.

Figure 1:
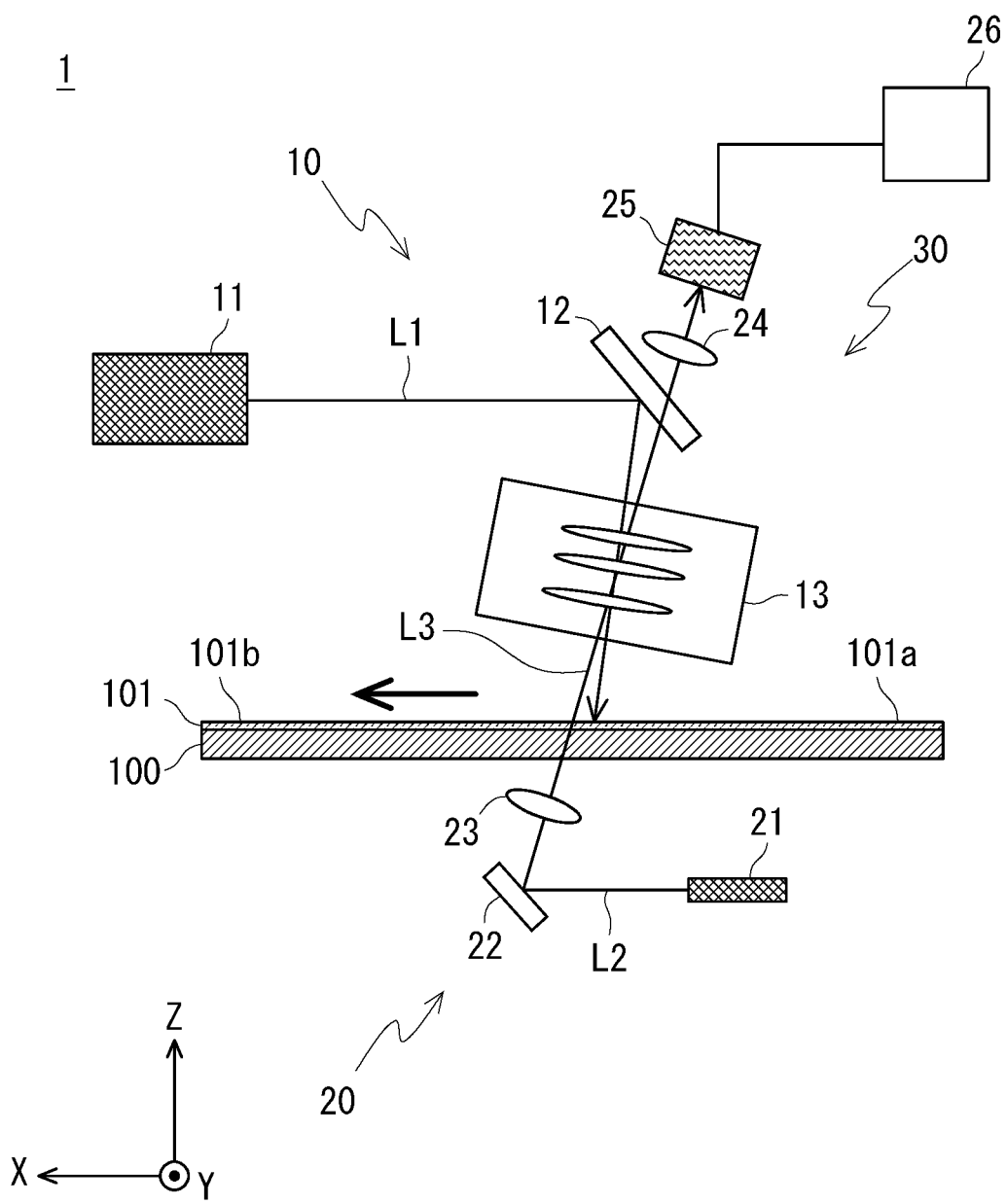
FIG. 1 is a diagram showing an optical system of a laser annealing apparatus according to the present embodiment.

(Optical system of ELA apparatus) A configuration of an ELA apparatus 1 according to the present embodiment is described with reference to FIG. 1. FIG. 1 is a diagram schematically showing an optical system of the ELA apparatus 1. The ELA apparatus 1 irradiates a silicon film 101 formed on a substrate 100 with a laser beam L1. This converts an amorphous silicon film (a-Si film) 101 into a polysilicon film (p-Si film) 101. The substrate 100 is, for example, a transparent substrate such as a glass substrate.

Note that, an XYZ three-dimensional orthogonal coordinate system is shown in FIG. 1 to clarify the description. The Z direction is the vertical direction and perpendicular to the substrate 100. The XY plane is parallel to the surface of the substrate 100 on which the silicon film 101 is formed. The X direction is the longitudinal direction of the rectangular substrate 100, and the Y direction is the latitudinal direction of the substrate 100. In the ELA apparatus 1, the silicon film 101 is irradiated with the laser beam L1 while the substrate 100 is being conveyed in the +X direction with a conveyance mechanism (not shown) such as a stage. With regard to the silicon film 101 in FIG. 1, the silicon film 101 before the irradiation with the laser beam L1 is referred to as an amorphous silicon film 101a, and the silicon film 101 after the irradiation with the laser beam L1 is referred to as a polysilicon film 101b.

The ELA apparatus 1 includes an annealing optical system 10, an illumination optical system 20, and a detection optical system 30. The annealing optical system 10 irradiates the silicon film 101 with the laser beam L1 for crystallizing the amorphous silicon film 101a. The illumination optical system 20 and the detection optical system 30 evaluate ununiformity in the crystalline state of the substrate 100.

Specifically, the ELA apparatus 1 includes a laser beam source 11, a mirror 12, a projection lens 13, a probe beam source 21, a mirror 22, a lens 23, a condenser lens 24, a photodetector 25, and a processing apparatus 26.

First, the annealing optical system 10 that irradiates the silicon film 101 with the laser beam L1 is described. The annealing optical system 10 is disposed above the substrate 100 (at the +Z side). The laser beam source 11 is, for example, an excimer laser beam source that emits an excimer laser beam having a center wavelength of 308 nm. The laser beam source 11 emits a pulsed laser beam L1. The laser beam source 11 emits the laser beam L1 toward the mirror 12.

The mirror 12 and the projection lens 13 are disposed above the substrate 100. The mirror 12 is a dichroic mirror that selectively transmits light according to, for example, a wavelength. The mirror 12 reflects the laser beam L1.

The laser beam L1 is reflected by the mirror 12 and enters the projection lens 13. The projection lens 13 includes a plurality of lens for projecting the laser beam L1 on the substrate 100, that is, on the silicon film 101.

The projection lens 13 condenses the laser beam L1 on the substrate 100. Here, the shape of an irradiation region P1 of the laser beam L1 on the substrate 100 is described with reference to FIG. 2. The laser beam L1 forms a linear irradiation region P1 along the Y direction on the substrate 100. That is, the laser beam L1 is a line beam having its longitudinal direction in the Y direction on the substrate 100. The silicon film 101 is irradiated with the laser beam L1 while the substrate 100 is being conveyed in the +X direction. Thus, a belt-shaped region having the length of the irradiation region P1 in the Y direction as its width can be irradiated with the laser beam L1.

Next, the illumination optical system 20 that irradiates the substrate 100 with a probe beam L2 is described with reference to FIG. 1. The illumination optical system 20 is disposed under the substrate 100 (at the −Z side). The probe beam source 21 emits a probe beam L2 having a different wavelength from the laser beam L1. For example, a continuous wave (CW) semiconductor laser beam source or the like can be used as the probe beam source 21. The center wavelength of the probe beam L2 is, for example, 401 nm. The wavelength of the probe beam L2 is preferably a wavelength with a low absorption rate at the silicon film 101. Thus, it is preferable that a laser beam source, a light emitting diode (LED) light source, or the like that emits monochromatic light is used as the probe beam source 21.

Figure 2:
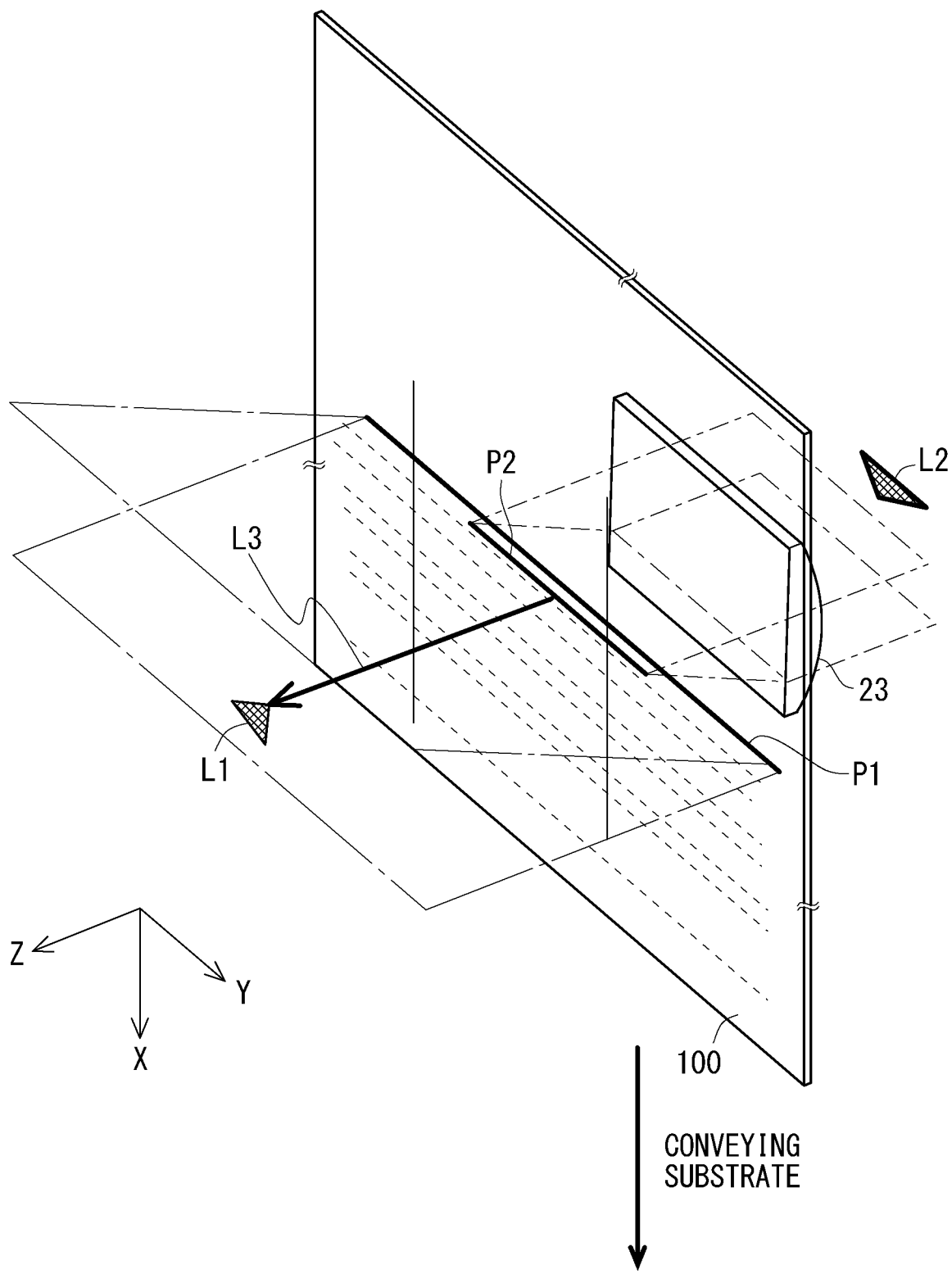
FIG. 2 is a perspective view for explaining a laser beam and a probe beam that enter a substrate in the laser annealing apparatus.

The probe beam source 21 emits the probe beam L2 toward the mirror 22. The mirror 22 reflects the probe beam L2 toward the lens 23. The lens 23 condenses the probe beam L2 on the silicon film 101. As shown in FIG. 2, a cylindrical lens can be used as the lens 23. Accordingly, the probe beam L2 forms a linear illumination region P2 along the Y direction on the substrate 100 (the silicon film 101). That is, the probe beam L2 is a line beam having its longitudinal direction in the Y direction on the substrate 100. In addition, the length of the illumination region P2 in the Y direction is shorter than the irradiation region P1.

The illumination region P2 of the probe beam L2 is disposed at the +X side compared to the irradiation region P1 of the laser beam L1. That is, the probe beam L2 enters the substrate 100 at an upper stream side in the conveying direction of the substrate 100 than the irradiation region P1 of the laser beam L1. Accordingly, the crystallized polysilicon film 101b is irradiated with the probe beam L2 as shown in FIG. 1.

Next, the detection optical system 30 that guides a probe beam L3 transmitted through the silicon film 101 to the photodetector 25 is described. The detection optical system 30 is disposed above the substrate 100. Note that, FIG. 1 shows the probe beam transmitted through the silicon film 101 as the probe beam L3. The transmittance of the silicon film 101 to a probe beam varies according to the crystalline state of silicon.

The probe beam L3 transmitted through the silicon film 101 enters the projection lens 13. The probe beam L3 refracted by the projection lens 13 enters the mirror 12. Note that, the mirror 12 is a dichroic mirror that transmits or reflects light according to a wavelength as described above. The mirror 12 transmits the probe beam L3 having the wavelength of 401 nm and reflects the laser beam L1 having the wavelength of 308 nm. Thus, the probe beam L3 is branched from the optical path of the laser beam L1. The mirror 12 serves as a light branching means for branching the optical path of the laser beam L1 and the optical path of the probe beam L3 according to a wavelength.

The probe beam L3 having passed through the mirror 12 enters the condenser lens 24. The condenser lens 24 condenses the probe beam L3 on the light-receiving surface of the photodetector 25. The photodetector 25 is, for example, a photo diode and detects the probe beam L3. The photodetector 25 outputs a detection signal according to the detection light amount of the probe beam L3 to the processing apparatus 26. The detection value of the detection signal corresponds to the transmittance of the silicon film 101. In addition, since the substrate 100 is conveyed in the +X direction at a constant speed, the photodetector 25 detects the profile of the detection light amount in the X direction (that is, the transmittance of the silicon film 101).

The processing apparatus 26 is an operation unit that performs predetermined operation to the detection value of the detection signal. Note that, the processing apparatus 26 may includes an A/D converter that A/D-converts an analogue detection signal into a digital detection value. Alternatively, the photodetector 25 may includes an A/D converter that A/D-converts an analogue detection signal into a digital detection value.

While scanning the substrate 100 in the +X direction, the photodetector 25 detects the probe beam L3. Thus, the processing apparatus 26 acquires a plurality of detection values according to the sampling rate of the photodetector 25 or the A/D converter. The processing apparatus 26 includes a memory that stores the detection values. Since the substrate 100 is scanned in the +X direction at a constant speed, the detection values indicate the profile of the transmittance in the X direction. If the crystalline state of the silicon film 101 is ununiform, different detection values according to the illumination positions are acquired. If the crystalline state of the silicon film 101 is uniform, the detection values are substantially the same value.

The processing apparatus 26 determines the quality of the substrate 100 based on the standard deviation of the detection values. That is, when the standard deviation is less than a preset threshold, the processing apparatus 26 determines that the ununiformity in the crystalline state is small. In this case, the processing apparatus 26 that the polysilicon film 101b is formed uniformly and that the substrate 100 is non-defective. On the other hand, when the standard deviation is equal to or greater than the preset threshold, the processing apparatus 26 determines that the ununiformity in the crystalline state is large. In this case, the processing apparatus 26 determines that the polysilicon film with large ununiformity is formed and that the substrate 100 is defective. The processing of the processing apparatus 26 is to be described later.

Figure 3:
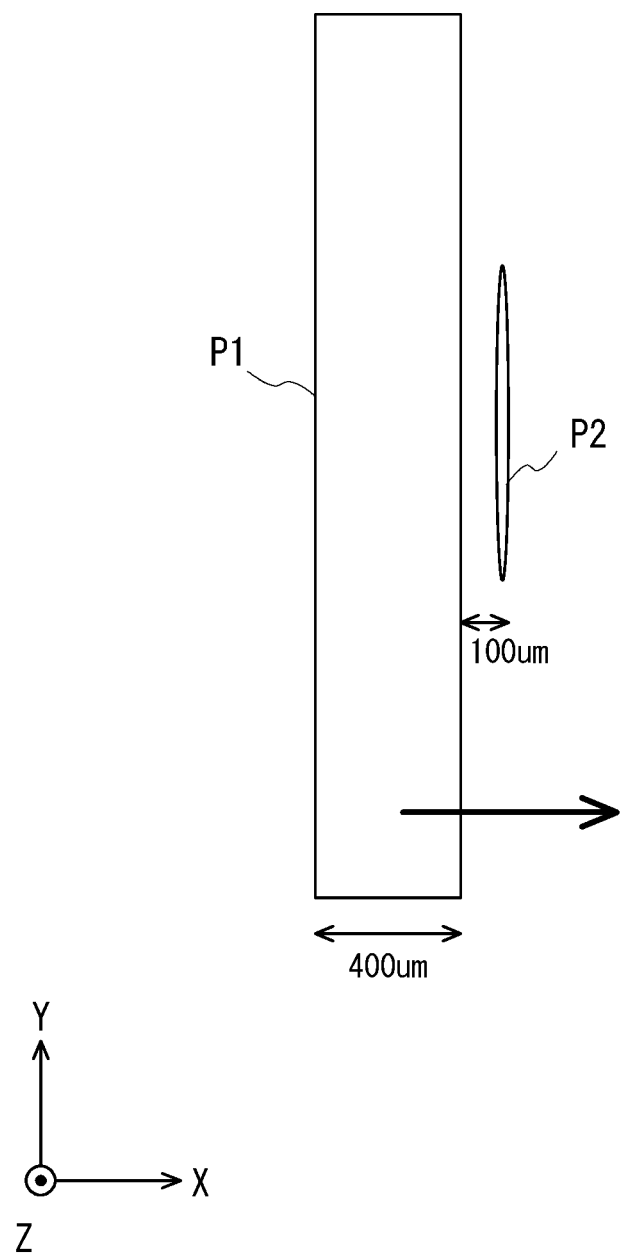
FIG. 3 is a diagram for explaining a laser beam and a probe beam that enter a substrate.
Figure 4:
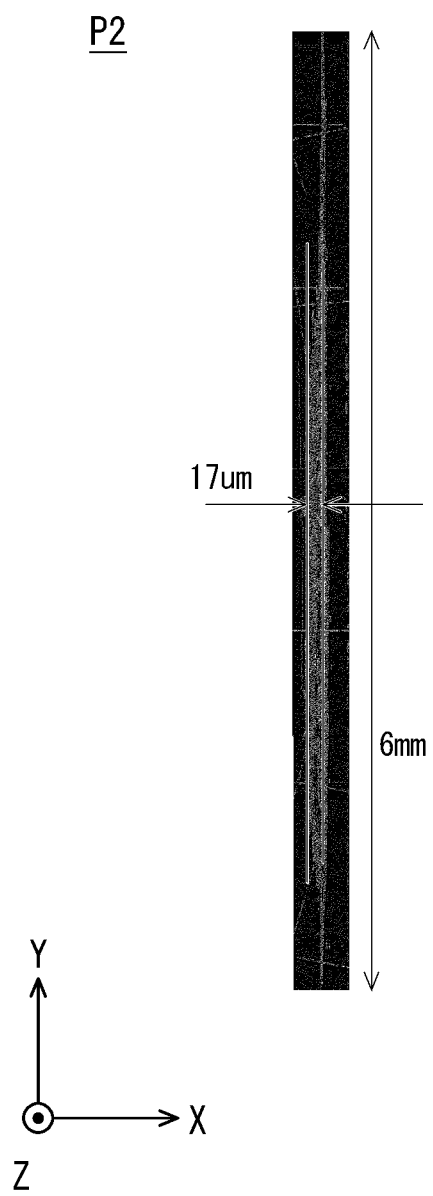
FIG. 4 is a diagram showing a probe beam that enters a substrate.

With reference to FIGS. 3 and 4, the illumination region P2 of the probe beam L2 on the substrate 100 is described. FIG. 3 is an XY plan view showing examples of the illumination region P2 of the probe beam L2 and the irradiation region P1 of the laser beam L1. FIG. 4 shows the probe beam L2 measured by a beam profiler.

As shown in FIG. 3, the width of the irradiation region P1 in the X direction is 400 In addition, a gap of 100 μm is provided between the irradiation region P1 and the illumination region P2 in the X direction. The length of the irradiation region P1 in the Y direction is longer than the length of the illumination region P2. As shown in FIG. 4, the length of the illumination region P2 in the Y direction is 6 mm. The maximum width of the illumination region P2 in the X direction is 17 Note that, when the irradiation region P1 is smaller than the size of the substrate 100 in the Y direction, the substrate 100 is moved in the Y direction to perform annealing treatment. Accordingly, a silicon film 100 is crystallized on the entire substrate 100.

Here, it is assumed that the conveyance speed of the substrate 100 in the X direction is 12 mm/sec. Furthermore, it is assumed that the condensed size of the illumination region P2 is 17 μm, and that the measurement overlap is set to 50% (=8.5 μm). The sampling rate required in this case is 12000/8.5=1.411 kHz. Note that, the measurement overlap defines the size of the overlapped illumination region P2 between the two consecutive detection values. That is, the region overlapped by 8.5 μm is irradiated with the illumination region P2 corresponding to the first detection value and the illumination region P2 corresponding to the second detection value.

Figure 5:
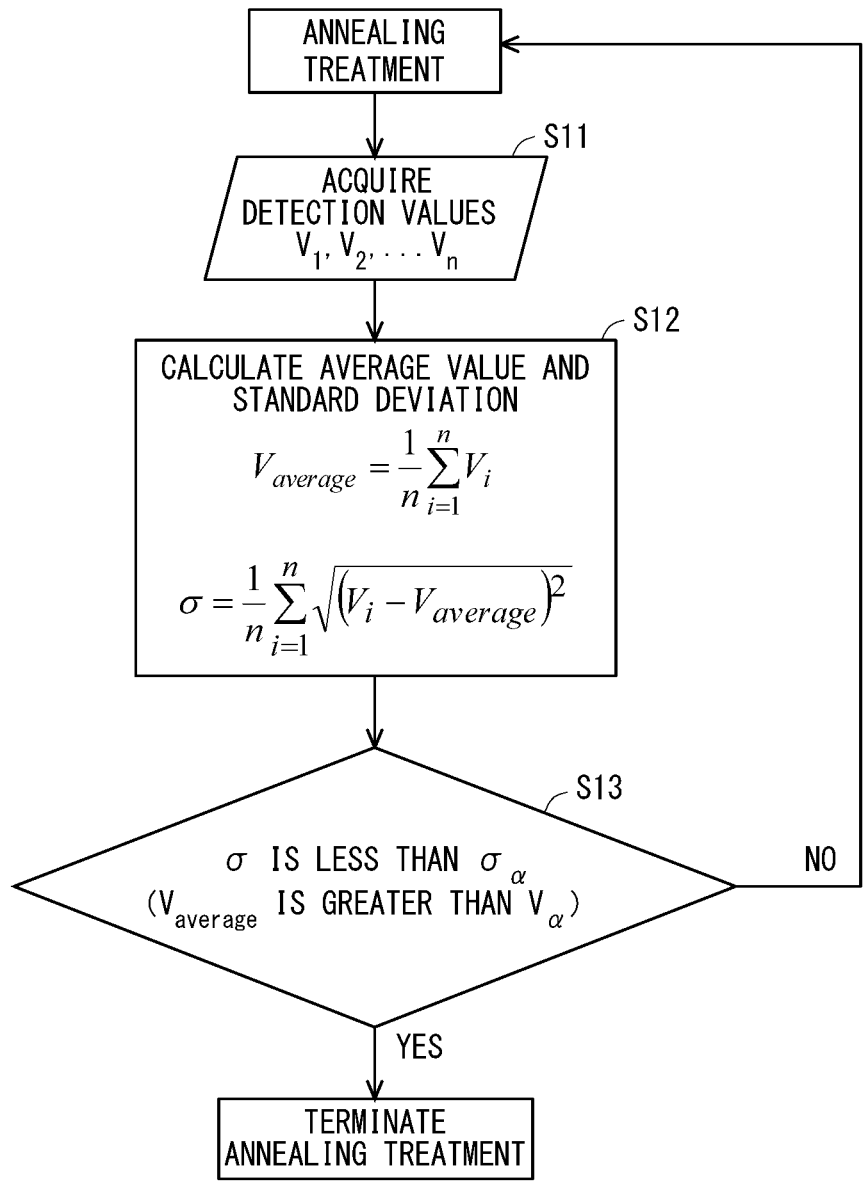
FIG. 5 is a flowchart showing an inspection method according to an embodiment.

Next, an inspection method according to the present embodiment is described with reference to FIG. 5. FIG. 5 is a flowchart showing the inspection method according to the present embodiment.

First, when annealing treatment is performed to the silicon film 101, the processing apparatus 26 acquires n numbers of detection values $V_1, V_2, \ldots, V_n$ (S11). Here, n is an integer of 2 or more. As the illumination position of the probe beam L2 is changed in the X direction, the detection values $V_1$ to $V_n$ are detected. For example, the detection value when the illumination position on the substrate 100 in the X direction is $X_1$ is $V_1$, and the detection value when the illumination position on the substrate 100 in the X direction is $X_2$ is $V_2$. The detection value when the illumination position on the substrate 100 in the X direction is $X_n$ is $V_n$.

In this manner, the photodetector 25 detects a detection value according to an illumination position in the X direction. As the illumination position onto the substrate 100 is changed by the substrate conveyance, the processing apparatus 26 acquires the detection values $V_1$ to $V_n$.

Then, the processing apparatus 26 calculates an average value $V_{average}$ and a standard deviation σ of the detection values $V_1$ to $V_n$ (S12). Specifically, a processor or an operation circuit provided to the processing apparatus 26 calculates the average value $V_{average}$ and the standard deviation σ based on the expressions shown in FIG. 5.

The processing apparatus 26 determines whether the calculated standard deviation σ is less than a threshold $σ_α$ (S13). That is, the processing apparatus 26 compares the standard deviation σ with the preset threshold $σ_α$. Then, when the standard deviation σ is less than the threshold $σ_α$ (YES in S13), the processing apparatus 26 determines the substrate 100 to be non-defective, and the treatment is terminated. On the other hand, when the standard deviation σ is equal to or greater than the threshold $σ_α$ (NO in S13), the processing apparatus 26 determines the substrate 100 to be defective, and returns to the annealing treatment. Accordingly, re-annealing treatment is performed to the defective substrate 100.

In the re-annealing treatment, the entire surface of the substrate 100 is irradiated with the laser beam L1 similarly to the first annealing treatment. In the re-annealing treatment, the substrate 100 is irradiated with the laser beam L1 having a weaker irradiation intensity than that in the first annealing treatment. The portion where the irradiation light amount of the laser beam L1 has been insufficient to be adequately crystallized can be certainly crystallized. In addition, the photodetector 25 may detect the probe beam L3, and the processing apparatus 26 may determine the crystalline state similarly in the re-annealing treatment.

Furthermore, the substrate 100 may be partially irradiated with the laser beam L1 in the re-annealing treatment. It is thereby possible to shorten the time required for the re-annealing treatment. For example, the measurement range is divided into ten, and the processing apparatus 26 calculates ten standard deviations $σ_1$ to $σ_{10}$. Then, the portions having large standard deviations among the standard deviations $σ_1$ to $σ_{10}$ may be irradiated with the laser beam L1. For this reason, the processing apparatus 26 compares each of the standard deviations $σ_1$ to $σ_{10}$ with the threshold $σ_α$ to obtain the portions having standard deviations greater than the threshold $σ_α$. Then, the portions having the standard deviations greater than the threshold $σ_α$ are irradiated with the laser beam L1. In other words, the portions having the standard deviations less than the threshold $σ_α$ are not irradiated with the laser beam L1. It is obvious that the number of divisions of the substrate 100 is not limited to ten, and the number is only required to be two or more.

In the present embodiment, the quality determination based on the average value $V_{average}$ is performed in S13 in addition to the quality determination based on the standard deviation G. That is, the average value is added to the evaluation items as well as the standard deviation. Then, when either of the standard deviation or the average value does not meet the criterion, the processing apparatus 26 determines the substrate 100 to be defective. Note that, the quality determination based on the average value $V_{average}$ may not be performed. In this case, the processing apparatus 26 is only required to calculate the standard deviation σ without calculating the average value $V_{average}$ in step S12.

Specifically, it is determined whether the average value $V_{average}$ is less than a threshold $V_α$ (S13). That is, the processing apparatus 26 compares the average value $V_{average}$ with the preset threshold $V_α$. Then, when the average value $V_{average}$ is greater than the threshold $V_α$ (YES in S13), the processing apparatus 26 determines the substrate 100 to be non-defective and terminates the treatment. On the other hand, when the average value $V_{average}$ is equal to or less than the threshold $V_α$ (YES in S13), the processing apparatus 26 determines the substrate 100 to be defective and returns to the annealing treatment. In this manner, by performing the quality determination based on both of the standard deviation σ and the average value $V_{average}$, it is possible to more properly evaluate the crystalline state. Thus, it is possible to improve the accuracy of the quality determination. Then, the laser annealing apparatus 1 performs re-annealing treatment to the substrate 100 determined to be defective. Accordingly, it is possible to certainly crystallize the portion where the irradiation light amount of the laser beam L1 has been insufficient to be adequately crystallized. Thus, it is possible to improve the ununiformity in the crystalline state.

In this manner, the photodetector 25 detects the probe beam L3 transmitted through the substrate 100 in the present embodiment. Since the probe beam L3 is detected at different illumination positions by the photodetector 25, the processing apparatus 26 acquires a plurality of detection values. The processing apparatus 26 performs the quality determination based on the standard deviation of the detection values. It is thereby possible to properly evaluate ununiformity in the polysilicon film 101b. Thus, it is possible to further improve the accuracy of the quality determination. Especially when the laser beam L1 is a linear pulsed laser beam, stripes of light and darkness along the line (also referred to as shot unevenness) can appear on the silicon film 101. It is possible for the ELA apparatus 1 according to the present embodiment to reduce the shot unevenness.

In the present embodiment, by adding not only the standard deviation σ of the detection values but also the average value $V_{average}$ to the evaluation items, it is possible to further improve the accuracy of the quality determination. In addition, the re-annealing treatment is performed to the substrate 100 determined to be defective. It is possible to certainly crystallize the portion where the irradiation light amount of the laser beam L1 has been insufficient to be adequately crystallized. Thus, it is possible to improve the yield and to increase the productivity.

Furthermore, while a substrate is being conveyed by a stage or the like, the substrate 100 is irradiated simultaneously with the laser beam L1 and the probe beam L2. It is thereby possible to detect the probe beam L3 transmitted through the silicon film 101 during laser annealing. Thus, it is possible to determine whether the state of the surface of the silicon film 101 is optimal in a short time.

In the present embodiment, the illumination region P2 of the probe beam L2 is disposed in the vicinity of the irradiation region P1 of the laser beam L1. Accordingly, it is possible to evaluate the crystalline state of the silicon film 101 immediately after being crystallized. Thus, it is possible to evaluate ununiformity in the crystalline state of the silicon film 101 substantially on time and to improve the accuracy of the quality determination.

In addition, the photodetector 25 detects the probe beam having passed through the projection lens 13 in order to bring the illumination region P2 of the probe beam L2 closer to the irradiation region P1 of the laser beam L1. In other words, the projection lens 13 is disposed in the optical path from the probe beam source 21 to the photodetector 25. The projection lens 13 is shared by the annealing optical system 10 and the illumination optical system 20. Accordingly, it is possible to bring the illumination region P2 closer to the irradiation region P1 on the substrate 100.

In the present embodiment, the substrate 100 is irradiated with the linear illumination region P2. Thus, it is possible to reduce the influence of small dirt, dust, or the like. For example, in the case of the irradiation with a point-like illumination region, if dirt or the like is attached to the illumination region, the transmittance is greatly lowered. In this case, the detection value at the portion to which the dirt or the like is attached is greatly lowered, and the standard deviation becomes larger. On the other hand, by the irradiation with the linear illumination region P2 as described in the present embodiment, it is possible to reduce the influence of small dirt or the like. That is, since the region having a wide width in the Y direction is irradiated, it is possible to improve the accuracy of the quality determination compared with the irradiation with a point-like illumination region. Furthermore, since the illumination region P2 is parallel to the linear irradiation region P1, it is possible to properly evaluate shot unevenness which is stripes of light and darkness along the Y direction.

In the present embodiment, the condenser lens 24 is disposed in front of the photodetector 25. The condenser lens 24 condenses the probe beam L3 on the light-receiving surface of the photodetector 25. That is, the probe beam L3 forms a point-like spot on the light-receiving surface of the photodetector 25. Thus, it is possible to use a diode having a small light-receiving region as the photodetector 25. Accordingly, it is not necessary to use a camera in which light-receiving pixels are arranged in an array or the like as the photodetector 25. Furthermore, it is out necessary to perform image processing to images by the camera. Thus, it is possible to simplify the configuration and the processing of the apparatus.

(Measurement Result)

Figure 6:
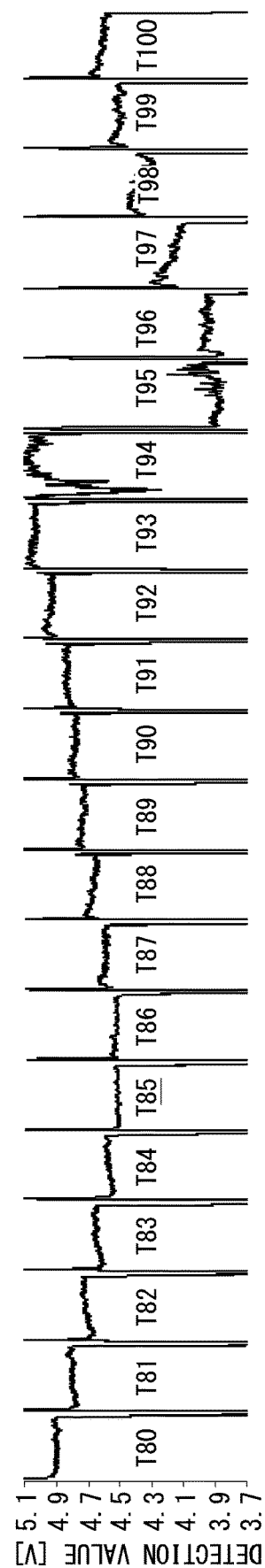
FIG. 6 is a graph showing detection values in a condition-setting substrate.

FIG. 6 shows a measurement result of the probe beam L3. FIG. 6 is a graph showing a measurement result in a condition-setting substrate. The graph shows the measurement result of the probe beam L3 when the irradiation intensity of the laser beam L1 to one substrate 100 is changed. Specifically, the substrate 100 is divided into 21 regions T80 to T100 as shown in FIG. 6, and the irradiation intensity of the laser beam L1 is changed at each region. The irradiation intensity is gradually increased from the region T80 toward the region T100. Specifically, the numeral representing each region means the irradiation intensity when the irradiation intensity at the region T100 is set to 100. For example, the region T80 means the 80% irradiation intensity of the region T100, and the region T81 means the 81% irradiation intensity of the region T100. Note that, the irradiation intensity at each region is constant. The vertical axis indicates a detection value of a detection signal of the photodetector 25. The detection value in this graph corresponds to the voltage [V] of the detection signal output from the photodetector 25.

Figure 7:
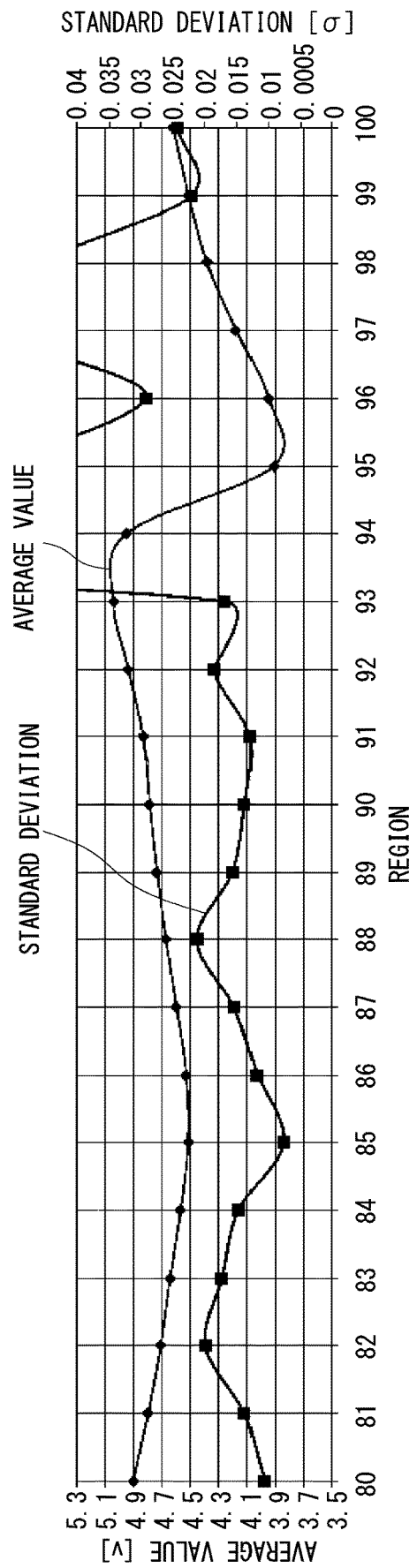
FIG. 7 is a graph showing the average values and the standard deviations of detection values in a condition-setting substrate.

FIG. 7 shows the average value and the standard deviation σ of the detection values V at each region. It is assumed that the characteristic of the silicon film 101 is more excellent as the detection values V are smaller. In this case, the region having the smallest average value is the region T95, but the region having the smallest standard deviation σ is the region T85. Thus, the irradiation intensity at the region T85 can be the optimized irradiation intensity. In other words, the average value is small but the variation of the detection value is large at the region T95, and the standard deviation value is large. For this reason, ununiformity in the crystalline state is increased, and a defective rate can be increased. By performing the annealing treatment using the laser beam L1 having the irradiation intensity at the region T85, it is possible to form the polysilicon film 101b having a uniform crystalline state.

Figure 8:
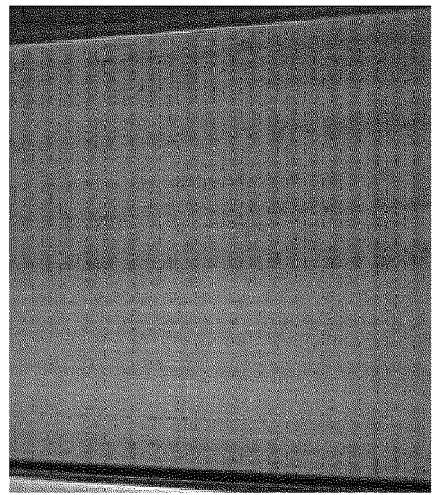
FIG. 8 is a diagram showing the captured images and the standard deviations of three substrates.
Figure 8:
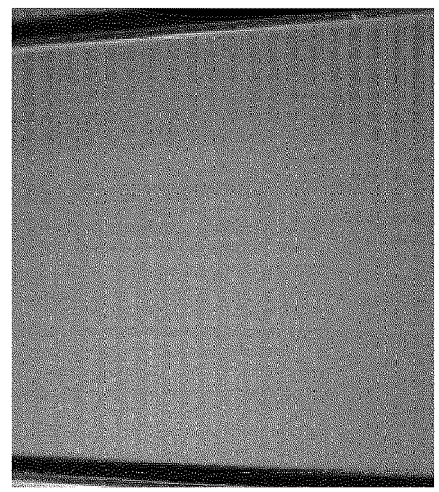
Figure 8:
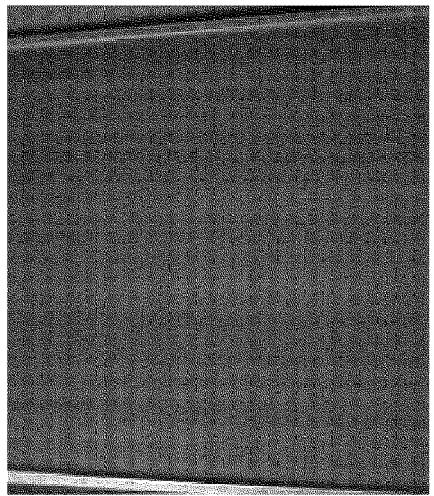
Figure 8:
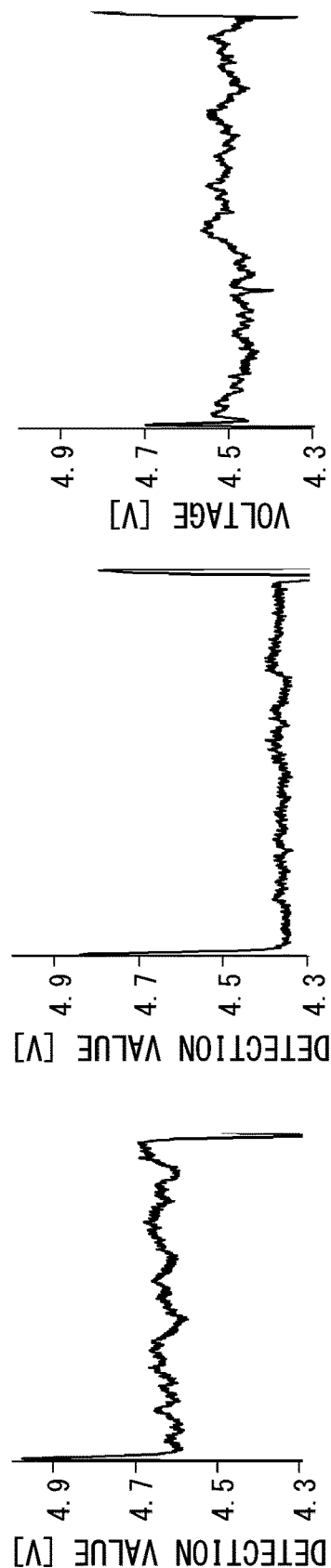

FIG. 8 is a diagram showing images of the substrate 100 captured by a camera and measurement results by the photodetector 25. FIG. 8 shows three substrate 100 as substrates I to III, and the irradiation intensity of the laser beam L1 to each substrate is changed. In addition, each of the substrates I to III is irradiated with the laser beam L1 having the constant irradiation intensity. The captured images are shown at the upper part of FIG. 8, and the detection values (voltage values) are shown at the lower part. FIG. 8 shows that the detection values vary in the substrates I and III the images of which have large uneven brightness. On the other hand, the variation in the detection values is small in the substrate II the image of which has small uneven brightness. In this manner, by performing inspection based on the standard deviation of the detection values, it is possible to improve the accuracy of the quality determination.

Figure 9:
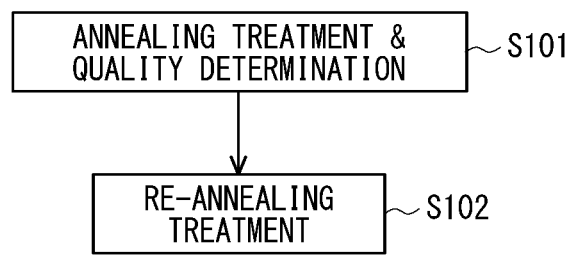
FIG. 9 is a flowchart showing a method for forming a polysilicon film using an ELA apparatus according to the present embodiment.
Figure 10:
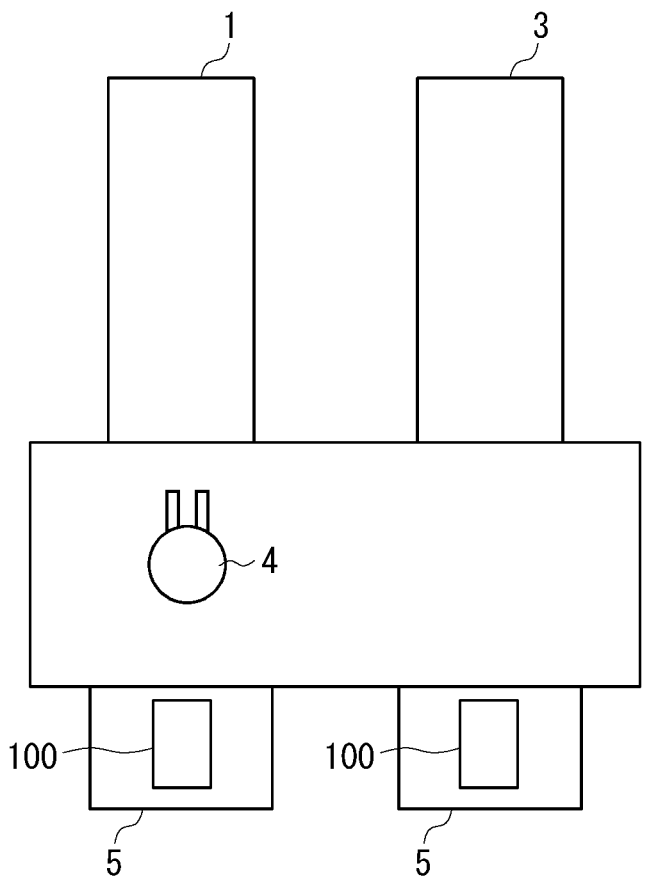
FIG. 10 is a diagram showing an apparatus layout including the ELA apparatus according to the present embodiment.

(Method for Forming Polysilicon Film) In the present embodiment, since the ELA apparatus 1 has a function of quality determination, it is possible to further increase the productivity. This point is described with reference to FIGS. 9 and 10. FIG. 9 is a flowchart showing a method for forming a polysilicon film using the ELA apparatus 1. More specifically, FIG. 9 shows a forming method when a substrate is determined to be defective by the inspection method according to the present embodiment. FIG. 10 is a diagram showing an apparatus layout for the ELA apparatus 1 and a cleaning apparatus 3 in a manufacturing factory.

First, the ELA apparatus 1 performs the annealing treatment and the quality determination (S101). Specifically, a transfer robot 4 takes out the substrate 100 with an amorphous silicon film cleaned by the cleaning apparatus 3 from a cassette 5. Then, the transfer robot 4 carries the substrate 100 in the ELA apparatus 1. Note that, the transfer robot 4 includes two hands and can hold the substrate 100 to be carried in each apparatus and the substrate 100 to be carried out of each apparatus at the same time.

Then, the substrate 100 is irradiated with the laser beam L1 and the probe beam L2 while the substrate 100 is being conveyed as shown in FIG. 1 and the like. For example, by driving a stage or the like to convey the substrate 100, the annealing treatment and the quality determination are performed. Since the substrate 100 is irradiated simultaneously with the laser beam L1 and the probe beam L2, the annealing treatment and the quality determination are finished substantially at the same time. Since the photodetector 25 detects the probe beam L3 while the substrate 100 is being conveyed, the processing apparatus 26 acquires a plurality of detection values. Then, when the processing apparatus 26 determines the substrate 100 to be defective based on the standard deviation σ of the detection values, the re-annealing treatment is performed (S102). Here, steps S101 and S102 are performed in the same ELA apparatus 1. That is, it is possible to perform steps S101 and S102 without carrying the substrate 100 out of the ELA apparatus 1.

Figure 11:
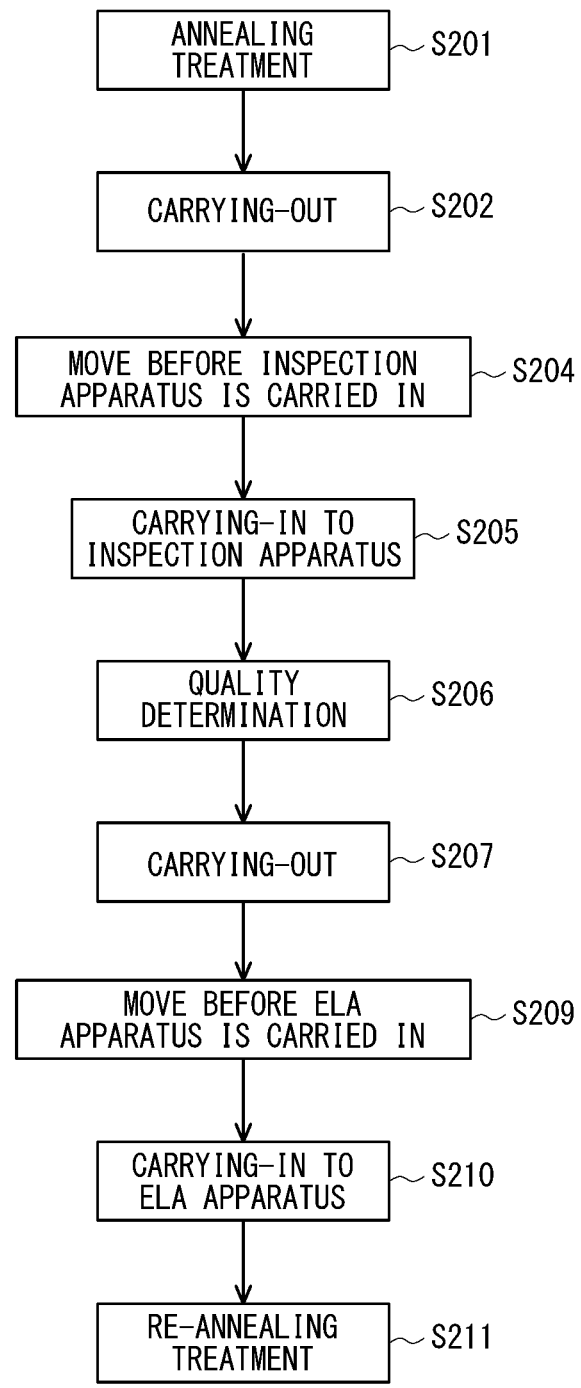
FIG. 11 is a flowchart showing a method for forming a polysilicon film using an ELA apparatus according to a comparison example.
Figure 12:
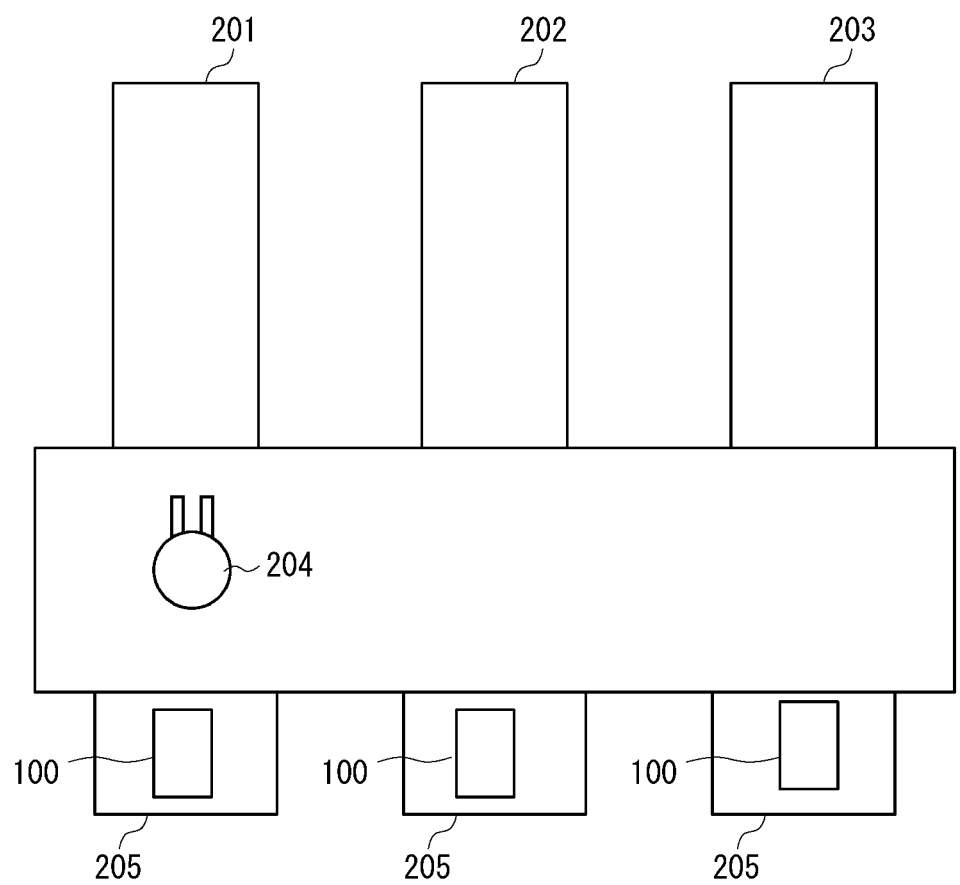
FIG. 12 is a diagram showing an apparatus layout including the ELA apparatus according to the comparison example.

Next, a method for forming a polysilicon film using an ELA apparatus according to a comparison example is described with reference to FIGS. 11 and 12. FIG. 11 is a flowchart showing a method for forming a polysilicon film using an ELA apparatus 201 according to a comparison example. FIG. 12 is a diagram showing a layout for the ELA apparatus 201, a cleaning apparatus 203, and an inspection apparatus 202 in a manufacturing factory. Note that, the ELA apparatus 201 according the comparison example does not have a function of quality determination. Thus, the inspection apparatus 202 is disposed in the vicinity of the ELA apparatus 201 and the cleaning apparatus 203. The inspection apparatus 202 performs the quality determination for the substrate 100.

First, the ELA apparatus 201 performs laser annealing treatment (S201). Specifically, a transfer robot 204 takes out the substrate 100 with an amorphous silicon film cleaned by the cleaning apparatus 203 from a cassette 205. Then, the transfer robot 204 carries the substrate 100 in the ELA apparatus 201. Then, the ELA apparatus 201 performs annealing treatment.

When the annealing treatment is finished, the transfer robot 204 carries the substrate 100 subjected to the annealing treatment out of the ELA apparatus (S202). When a mobile robot 204 that has carried the substrate 100 out moves before the inspection apparatus is carried in (S204), the transfer robot 204 carries the substrate 100 in the inspection apparatus 202 (S205).

The inspection apparatus 202 performs the quality determination for the carried-in substrate 100 (S206). Here, an example in which the substrate 100 is determined to be defective is described. The transfer robot 204 carries the substrate 100 out of the inspection apparatus 202 (S207). When the transfer robot 204 that has carried the substrate 100 out moves before the ELA apparatus 201 is carried in (S209), the transfer robot 204 carries the substrate 100 in the ELA apparatus 201 (S210). Then, the ELA apparatus 201 performs re-annealing treatment to the substrate 100 determined to be defective (S211).

In this manner, since the ELA apparatus 201 according to the comparison example does not have a function of quality determination, the number of times of carrying-in and carrying-out of the substrate 100 is increased. That is, the substrate 100 is required to be carried in and carried out of the inspection apparatus 202. This makes tact time longer, and it is difficult to improve the productivity. In addition, a cleaning process by the cleaning apparatus 203 can be required between the quality determination process by the inspection apparatus 202 (S206) and the re-annealing treatment S211 by the ELA apparatus 201. In this case, the number of times of carrying-in and carrying-out of the substrate 100 is further increased, and the productivity is lowered.

In other words, it is possible for the ELA apparatus 1 according to the present embodiment to manufacture the substrate 100 with a polysilicon film with high productivity. That is, since the number of times of carrying-in and carrying-out of the substrate 100 is reduced, it is possible to finish the treatment in a short time. Furthermore, since the annealing treatment and the quality determination are performed in the same ELA apparatus 1, it is not necessary to perform a cleaning process between the quality determination and the re-annealing treatment. Accordingly, it is possible to reduce the number of times of carrying-in and carrying-out of the substrate 100 and to improve the productivity. In addition, it is possible to evaluate the polysilicon film 101b immediately after the irradiation with the laser beam L1. Thus, it is possible to feed back the condition, such as transmittance, for the next substrate 100 and to perform laser irradiation under an appropriate condition.

Second Embodiment

Figure 13:
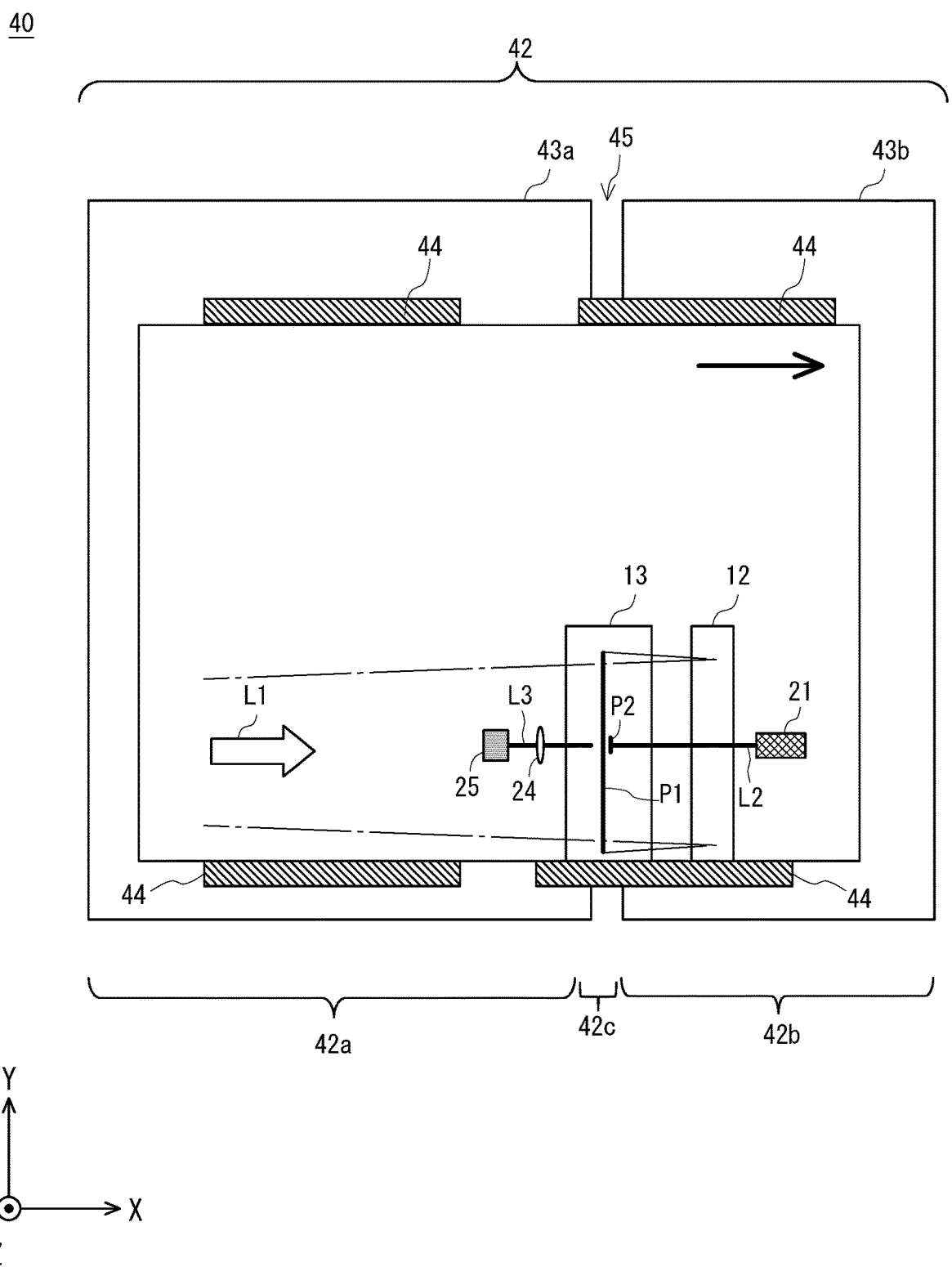
FIG. 13 is a plan view schematically showing a configuration of an ELA apparatus according to a second embodiment.
Figure 14:
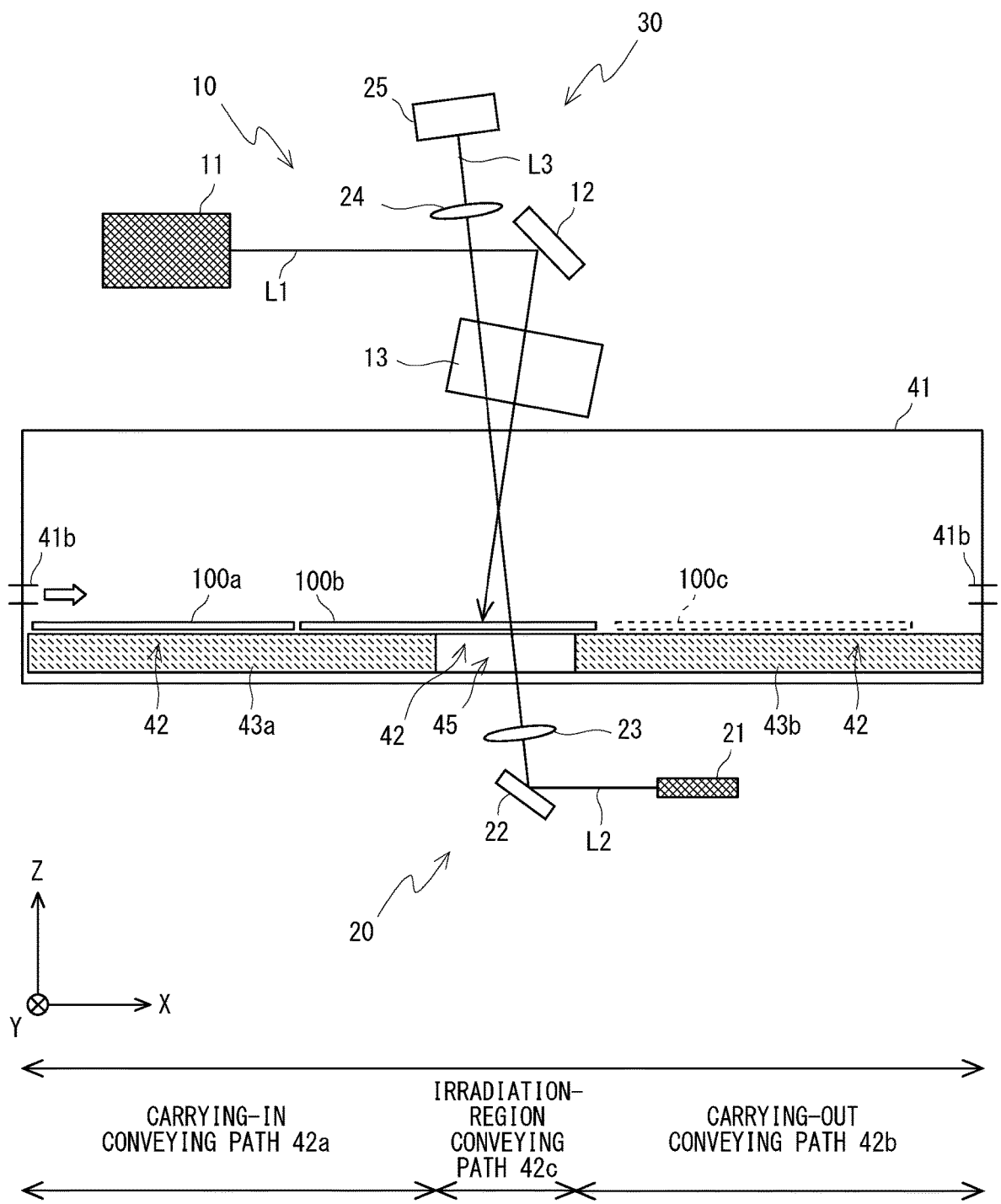
FIG. 14 is a side view schematically showing the configuration of the ELA apparatus according to the second embodiment.

An ELA apparatus 40 according to the present embodiment is described with reference to FIGS. 13 and 14. FIG. 13 is a plan view schematically showing a configuration of the ELA apparatus 40. FIG. 14 is a side view schematically showing the configuration of the ELA apparatus 40. The configuration of the apparatus is appropriately simplified in FIGS. 13 and 14. In the present embodiment, a function of quality determination is added to the ELA apparatus 40 provided with a gas-floating unit.

The ELA apparatus 40 includes a treatment room 41, a continuous conveying path 42, gas-floating units 43a and 43b, a suction part 44, and an opening 45. The treatment room 41 includes a carrying-in port 41a and a carrying-out port 41b. The ELA apparatus 40 includes, similarly to the first embodiment, an annealing optical system 10, an illumination optical system 20, and a detection optical system 30.

The ELA apparatus 40 according to the present embodiment is provided with the gas-floating units 43a and 43b that float a substrate 100 in the treatment room 41 in which annealing treatment is performed. Note that, the basic configuration except for the gas-floating units 43a and 43b is similar to the ELA apparatus 1 described in the first embodiment, and the description is appropriately omitted. For example, the optical system of the ELA apparatus 40 according to the present embodiment is substantially similar to that of the ELA apparatus 1 according to the first embodiment. However, a probe beam L3 enters a condenser lens 24 without passing through a mirror 12. In this case, a reflex mirror that reflects almost all incident light can be used as the mirror 12 instead of a dichroic mirror.

The treatment room 41 of the ELA apparatus 40 has a rectangular-parallelepiped wall part. The carrying-in port 41a (−X side) and the carrying-out port 41b (+X side) are provided on the walls facing in the longitudinal direction (the X direction) of the treatment room 41. Each of the carrying-in port 41a and the carrying-out port 41b may be opened or have an openable structure. The openable structure can be a simple sealing structure. Note that, the setting positions of the carrying-in port 41a and the carrying-out port 41b are only required to be along the conveying direction, and not limited to specific positions.

In the treatment room 41, the continuous conveying path 42 is provided from the carrying-in port 41a to the carrying-out port 41b. The gas-floating units 43a and 43b are disposed at the continuous conveying path 42. The gas-floating unit 43a is disposed at the carrying-in port 41a side, and the gas-floating unit 43b is disposed at the carrying-out port 41b side. The opening 45 is provided between the gas-floating unit 43a and the gas-floating unit 43b. The opening 45 corresponds to an irradiation region P1 at which laser annealing is performed.

The gas-floating units 43a and 43b are floating stages that jet gas upward from below, and float and support the substrate 100 over themselves. Note that, the gas-floating units 43a and 43b each have a plurality of jetting points (not shown) to adjust the posture and bending of the substrate 100.

As shown in FIG. 14, the part at which the gas-floating unit 43a is provided in the continuous conveying path 42 is referred to as a carrying-in conveying path 42a, and the part at which the gas-floating unit 43b is provided is referred to as a carrying-out conveying path 42b. In addition, the part corresponding to the opening 45 in the continuous conveying path 42 is referred to as an irradiation-region conveying path 42c.

The suction part 44 sucks the end portion of the substrate 100. The suction part 44 is moved along a guide rail (not shown) in the X direction while the suction part 44 is sucking the substrate 100. It is thereby possible to covey the substrate 100 in the +X direction.

The substrate 100 carried in from the carrying-in port 41*a* is conveyed in the order of the carrying-in conveying path 42*a*, the irradiation-region conveying path 42*c*, and the carrying-out conveying path 42*b*. Then, when conveyed to the end of the carrying-out conveying path 42*b*, the substrate 100 is carried out of the carrying-out port 41*b*. Specifically, the substrate 100 carried in from the carrying-in port 41*a* is floated by the gas from the gas-floating unit 43*a*. A floating substrate 1000 is conveyed in the +X direction (for example, a substrate 100*a* in FIG. 14). Then, when the substrate 100 reaches an illumination-region conveying path 42*c*, the annealing treatment and detection of a probe beam are performed (for example, a substrate 100*b* in FIG. 14).

At this time, the substrate 100 is irradiated with a laser beam L1 and a probe beam L2 at the opening 45 in the irradiation-region conveying path 42*c*. Thus, the illumination optical system 20 is disposed so that the probe beam L2 passes through the opening 45. For example, a lens 23 is disposed directly under the opening 45. In this manner, the probe beam L2 passes through the opening 45 disposed between the gas-floating unit 43*a* and the gas-floating unit 43*b*. That is, an illumination region P2 of the probe beam L2 is positioned in the irradiation-region conveying path 42*c*.

Then, the substrate 100 reaches the carrying-out conveying path 42*b*, the substrate 100 is floated by the gas from both of the gas-floating unit 43*a* and the gas-floating unit 43*b*. When the end of the substrate 100 passes the carrying-in conveying path 42*a*, the substrate 100 is floated by the gas from the gas-floating unit 43*b* (for example, a substrate 100*c* in FIG. 14).

An inspection method according to the present embodiment is suitable for the ELA apparatus 40 including a plurality of gas-floating units of the gas-floating units 43*a* and 43*b*. For example, the opening 45 is normally provided over the entire substrate 100 in the Y direction (see FIG. 13). Thus, it is possible for the ELA apparatus 40 according to the present embodiment to form the illumination region P2 at an arbitrary position in the Y direction. Accordingly, it is possible to form the illumination region P2 at, for example, the center of the substrate 100 in the Y direction. Thus, it is possible to evaluate the crystalline state at the center of the substrate 100 in the Y direction and to improve the accuracy of the quality determination.

Figure 15:
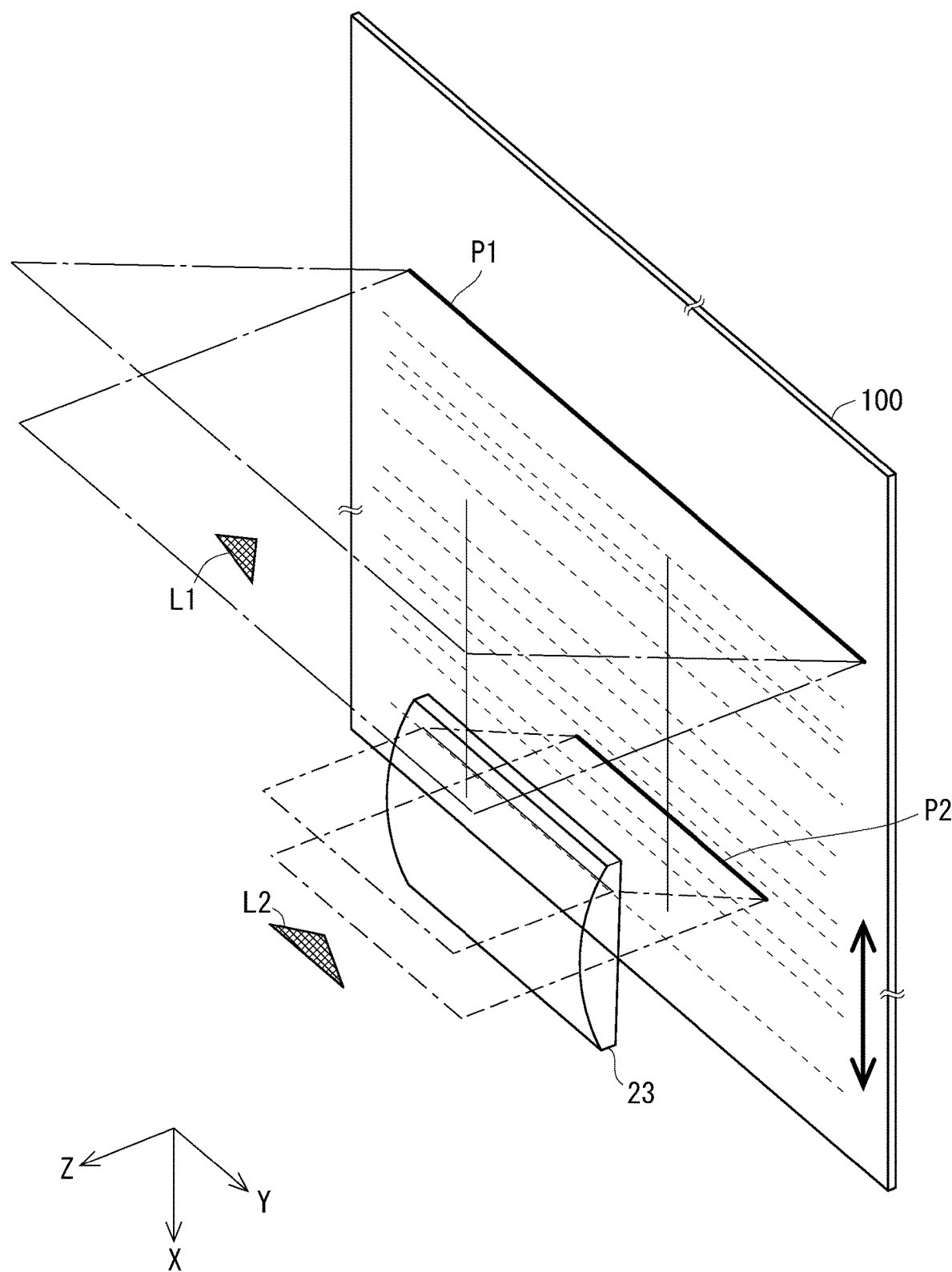
FIG. 15 is a diagram showing a configuration for a laser beam and a probe beam to enter a substrate from the same side.

Note that, the illumination optical system 20 is disposed under the substrate 100, and the detection optical system 30 is disposed above the substrate 100 in the first and second embodiments, but the positions of the illumination optical system 20 and the detection optical system 30 may be inverted. That is, the illumination optical system 20 can be disposed above the substrate 100, and the detection optical system 30 can be disposed under the substrate 100. In this case, the lens 23 is disposed at the +Z side of the substrate 100 as shown in FIG. 15. In second embodiment, the probe beam transmitted through the substrate 100 passes through the opening 45. In addition, when the illumination optical system 20 is disposed above the substrate 100 and the detection optical system 30 is disposed under the substrate 100, the probe beam L2 may be condensed with a lens different from the projection lens 13.

(Organic EL display) A semiconductor device having the above polysilicon film is suitable for a thin film transistor (TFT) array substrate used for an organic electro luminescence (EL) display. That is, the polysilicon film is used as a semiconductor layer having a source region, a channel region, and a drain region of a TFT.

Figure 16:
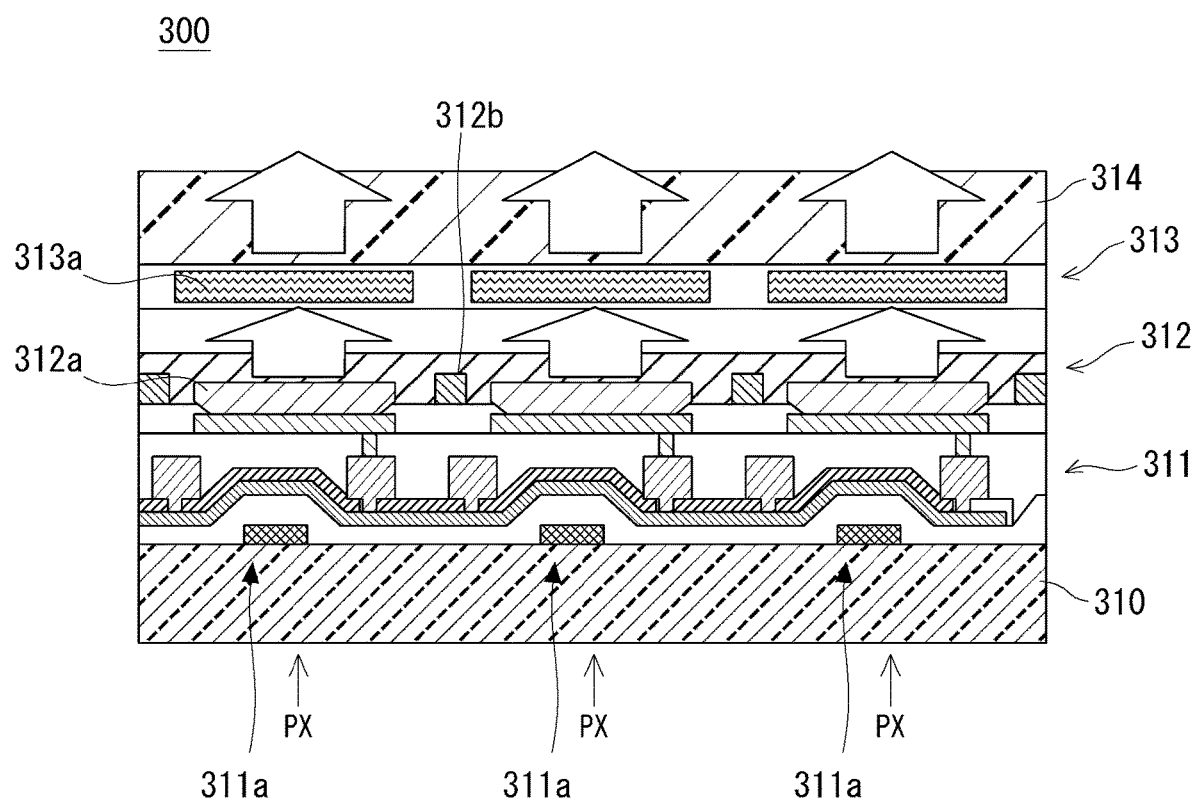
FIG. 16 is a cross-sectional view of a simplified configuration of an organic EL display.

Hereinafter, a case in which a semiconductor device according to the present embodiment is used for an organic EL display is described. FIG. 16 is a cross section of a pixel circuit of the organic EL display which is illustrated in a simplified manner. The organic EL display device 300 shown in FIG. 16 is an active-matrix-type display device in which a TFT is disposed in each pixel PX.

The organic EL display device 300 includes a substrate 310, a TFT layer 311, an organic layer 312, a color filter layer 313, and a sealing substrate 314. FIG. 14 shows a top-emission-type organic EL display device, in which the side of the sealing substrate 314 is located on the viewing side. Note that the following description is given to show an example of a configuration of an organic EL display device and this embodiment is not limited to the below-described configuration. For example, a semiconductor device according to this embodiment may be used for a bottom-emission-type organic EL display device.

The substrate 310 is a glass substrate or a metal substrate. The TFT layer 311 is provided on the substrate 310. The TFT layer 311 includes TFTs 311*a* disposed in the respective pixels PX. Further, the TFT layer 311 includes wiring lines (not shown) connected to the TFTs 311*a*, and the like. The TFTs 311*a*, the wiring lines, and the like constitute pixel circuits.

The organic layer 312 is provided on the TFT layer 311. The organic layer 312 includes an organic EL light-emitting element 312*a* disposed in each pixel PX. The organic EL light-emitting element 312*a* has, for example, a laminated structure in which an anode, a hole injection layer, a hole transport layer, a light-emitting layer, an electron transport layer, an electron injection layer, and a cathode are laminated. In the case of the top emission type, the anode is a metal electrode and the cathode is a transparent conductive film made of ITO (Indium Tin Oxide) or the like. Further, in the organic layer 312, separation walls 312*b* for separating organic EL light-emitting elements 312*a* are provided between pixels PX.

The color filter layer 313 is provided on the organic layer 312. The color filter layer 313 includes color filters 313*a* for performing color displaying. That is, in each pixel PX, a resin layer colored in R (red), G (green), or B (blue) is provided as the color filter 313*a*. When white light emitted from the organic layer 312 passes through the color filters 313*a*, the white light is converted into light having RGB colors. Note that in the case of a three-color system in which organic EL light-emitting elements capable of emitting each color of RGB are provided in the organic layer 312, the color filter layer 313 may be unnecessary.

The sealing substrate 314 is provided on the color filter layer 313. The sealing substrate 314 is a transparent substrate such as a glass substrate and is provided to prevent deterioration of the organic EL light-emitting elements of the organic layer 312.

Electric currents flowing through the organic EL light-emitting elements 312*a* of the organic layer 312 are changed by display signals supplied to the pixel circuits. Therefore, it is possible to control an amount of light emitted in each pixel PX by supplying a display signal corresponding to a display image to each pixel PX. As a result, it is possible to display a desired image.

In an active matrix display device such as an organic EL display, one pixel PX is provided with one or more TFTs (for example, a switching TFT and a driving TFT). Then, the TFT of each pixel PX is provided with a semiconductor layer having a source region, a channel region, and a drain region. The polysilicon film according to the present embodiment is suitable for a semiconductor layer of a TFT. That is, by using the polysilicon film manufactured by the above manufacturing method for a semiconductor layer of a TFT array substrate, it is possible to suppress in-plane ununiformity which is the TFT characteristics. Thus, it is possible to manufacture a display device having an excellent display characteristic with high productivity.

(Manufacturing Method of Semiconductor Device)

A manufacturing method of a semiconductor device using the ELA apparatus according to the present embodiment is suitable for manufacturing a TFT array substrate. The manufacturing method of a semiconductor device having a TFT is described with reference to FIGS. 17 to 24. FIGS. 17 to 24 are cross-sectional views showing processes for manufacturing a semiconductor device. In the following description, a manufacturing method of a semiconductor device having an inverted staggered TFT is described.

Figure 17:
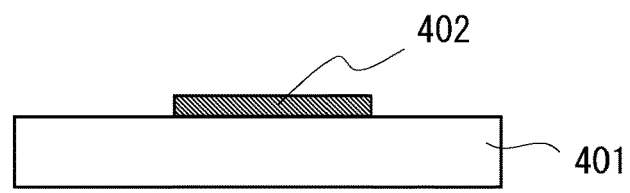
FIG. 17 is a cross-sectional view showing a process in a manufacturing method of a semiconductor device according to the present embodiment.

First, as shown in FIG. 17, a gate electrode 402 is formed on a glass substrate 401. Note that, the glass substrate 401 corresponds to the above substrate 100. As the gate electrode 402, for example, a metal thin film containing aluminium can be used. A metal thin film is formed on the glass substrate 401 by a sputtering method or a deposition method. Then, the metal thin film is patterned by photolithography to form the gate electrode 402. In a photolithography method, processing, such as resist coating, exposure, developing, etching, and resist stripping, is performed. Note that, various types of wiring may be formed in the same process as the patterning of the gate electrode 402.

Figure 18:
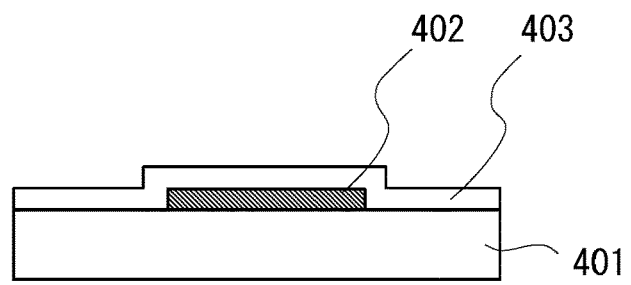
FIG. 18 is a cross-sectional view showing a process in a manufacturing method of a semiconductor device according to the present embodiment.
Figure 19:
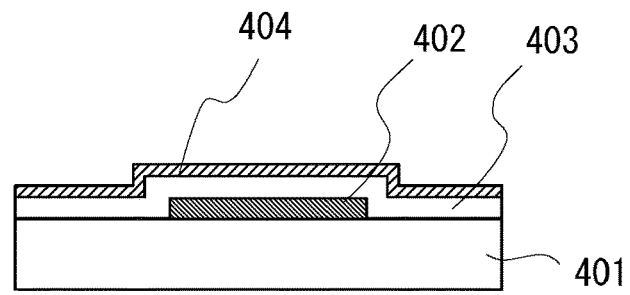
FIG. 19 is a cross-sectional view showing a process in a manufacturing method of a semiconductor device according to the present embodiment.

Next, a gate insulating film 403 is formed on the gate electrode 402 as shown in FIG. 18. The gate insulating film 403 is formed so as to cover the gate electrode 402. Then, an amorphous silicon film 404 is formed on the gate insulating film 403 as shown in FIG. 19. The amorphous silicon film 404 is arranged so as to overlap the gate electrode 402 interposing the gate insulating film 403.

The gate insulating film 403 is a silicon nitride film ($SiN_x$) or a silicon oxide film ($SiO_2$ film), or a lamination film thereof, or the like. Specifically, the gate insulating film 403 and the amorphous silicon film 404 are continuously formed by a chemical vapor deposition (CVD) method.

Figure 20:
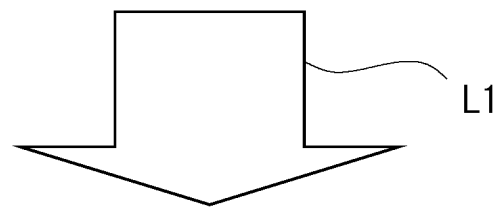
FIG. 20 is a cross-sectional view showing a process in a manufacturing method of a semiconductor device according to the present embodiment.
Figure 20:
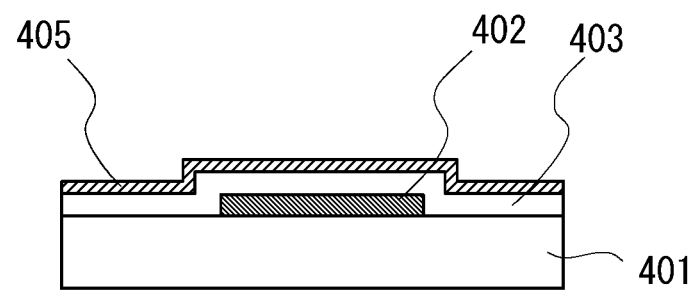

Then, the amorphous silicon film 404 is irradiated with the laser beam L1 to form a polysilicon film 405 as shown in FIG. 20. That is, the amorphous silicon film 404 is crystallized by the ELA apparatus 1 shown in FIG. 1 and the like. The polysilicon film 405 with silicon crystallized is thereby formed on the gate insulating film 403. The polysilicon film 405 corresponds to the above polysilicon film 101b.

At this time, the polysilicon film 405 is inspected by the inspection method according to the present embodiment. When the polysilicon film 405 does not meet a predetermined criterion, the polysilicon film 405 is irradiated with a laser beam again. Thus, it is possible to further uniformize the characteristic of the polysilicon film 405. Since the in-plane ununiformity can be suppressed, it is possible to manufacture a display device having an excellent display characteristic with high productivity.

Note that, although not shown, the polysilicon film 405 is pattered by a photolithography method. In addition, impurities may be introduced into the polysilicon film 405 by an ion implantation method or the like.

Figure 21:
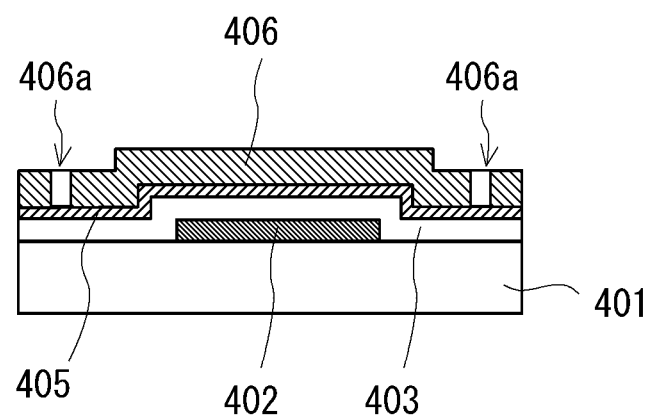

Then, an interlayer insulating film 406 is formed on the polysilicon film 405 as shown in FIG. 21. The interlayer insulating film 406 is provided with contact holes 406a for exposing the polysilicon film 405.

The interlayer insulating film 406 is a silicon nitride film ($SiN_x$) or a silicon oxide film ($SiO_2$ film), or a lamination film thereof, or the like. Specifically, the interlayer insulating film 406 is formed by a chemical vapor deposition (CVD) method. Then, the interlayer insulating film 406 is patterned by a photolithography method to form the contact holes 406a.

Figure 22:
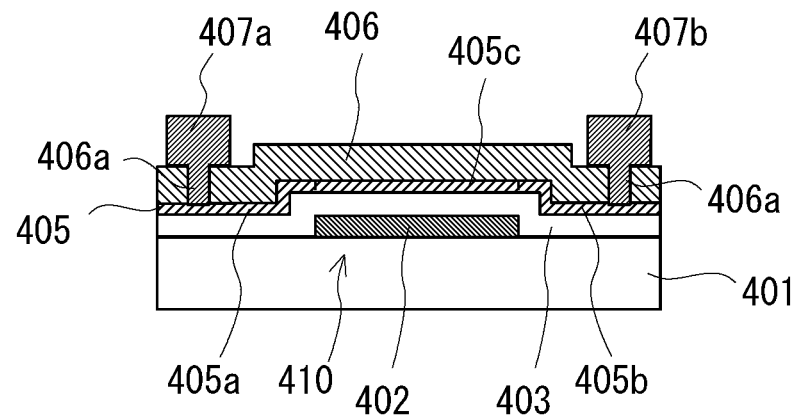
FIG. 22 is a cross-sectional view showing a process in a manufacturing method of a semiconductor device according to the present embodiment.

Next, a source electrode 407a and a drain electrode 407b are formed on the interlayer insulating film 406 as shown in FIG. 22. The source electrode 407a and the drain electrode 407b are formed so as to cover the contact holes 406a. That is, the source electrode 407a and the drain electrode 407b are formed from the inside of the contact holes 406a over the interlayer insulating film 406. Thus, the source electrode 407a and the drain electrode 407b are electrically connected to the polysilicon film 405 though the contact holes 406a.

Accordingly, a TFT 410 is formed. The TFT 410 corresponds to the above TFT 311a. The region overlapping the gate electrode 402 in the polysilicon film 405 is a channel region 405c. The source electrode 407a side of the polysilicon film 405 from the channel region 405c is a source region 405a, and the drain electrode 407b side is a drain region 405b.

The source electrode 407a and the drain electrode 407b are formed of a metal thin film containing aluminium. A metal thin film is formed on the interlayer insulating film 406 by a sputtering method or a deposition method. Then, the metal thin film is patterned by photolithography to form the source electrode 407a and the drain electrode 407b. Note that, various types of wiring may be formed in the same process as the patterning of the source electrode 407a and the drain electrode 407b.

Figure 23:
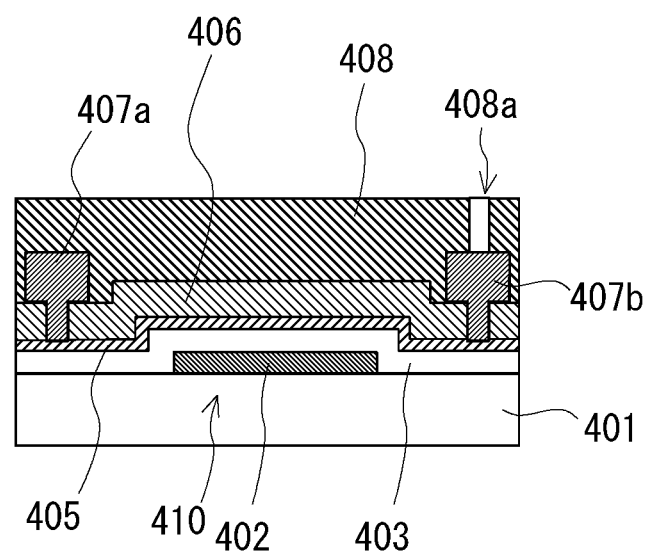
FIG. 23 is a cross-sectional view showing a process in a manufacturing method of a semiconductor device according to the present embodiment.

Then, a planarization film 408 is formed on the source electrode 407a and the drain electrode 407b as shown in FIG. 23. The planarization film 408 is formed so as to cover the source electrode 407a and the drain electrode 407b. The planarization film 408 is provided with a contact hole 408a for exposing the drain electrode 407b.

The planarization film 408 is formed of, for example, a photosensitive resin film. A photosensitive resin film is coated on the source electrode 407a and the drain electrode 407b, and exposed and developed. Accordingly, it is possible to pattern the planarization film 408 having the contact hole 408a.

Figure 24:
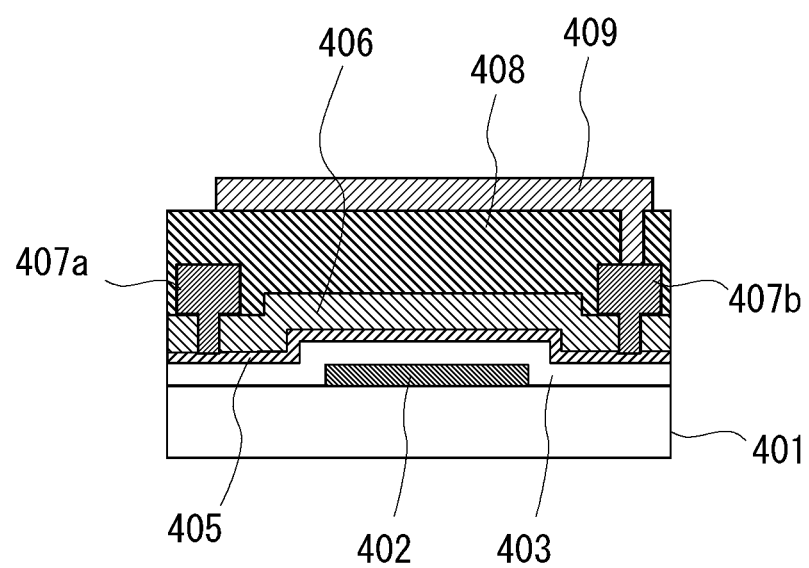
FIG. 24 is a cross-sectional view showing a process in a manufacturing method of a semiconductor device according to the present embodiment.

Then, a pixel electrode 409 is formed on the planarization film 408 as shown in FIG. 24. The pixel electrode 409 is formed so as to cover the contact hole 408a. That is, the pixel electrode 409 is formed from the inside of the contact hole 408a over the planarization film 408. Thus, the pixel electrode 409 is electrically connected to the drain electrode 407b through the contact hole 408a.

The pixel electrode 409 is formed of a transparent conductive film or a metal thin film containing aluminium. A conductive film (a transparent conductive film or a metal thin film) is formed on the planarization film 408 by a sputtering method. Then, the conductive film is patterned by the photolithography method. The pixel electrode 409 is thereby formed on the planarization film 408. In the case of a driving TFT of an organic EL display, the organic EL light emitting device 312a, the color filter (CF) 313a, and the like as shown FIG. 16 are formed on the pixel electrode 409. Note that, in the case of a top-emission type organic EL display, the pixel electrode 409 is formed of a metal thin film containing aluminium or silver which have a high reflectance. In the case of a bottom-emission type organic EL display, the pixel electrode 409 is formed of a transparent conductive film such as ITO.

The processes for manufacturing an inverted staggered TFT has been described. The manufacturing method according to the present embodiment may be applied to manufacture of an inverted staggered TFT. It is obvious that the manufacturing method of a TFT is not limited to a TFT for an organic EL display and can be applied to manufacture of a TFT for a liquid crystal display (LCD).

In addition, it has been described that the laser annealing apparatus according to the present embodiment irradiates an amorphous silicon film with a laser beam to form a polysilicon film in the above description, but the laser annealing apparatus may irradiate an amorphous silicon film with a laser beam to form a micro-crystal silicon film. Furthermore, a laser beam for performing annealing is not limited to excimer laser. In addition, the method according to the present embodiment can be applied to a laser annealing apparatus that crystallizes thin films other than a silicon film. That is, as long as the laser annealing apparatus irradiates an amorphous film with a laser beam to form a crystallized film, the method according to the present embodiment can be applied. It is possible for the laser annealing apparatus according to the present embodiment to properly evaluate a substrate with a crystallized film.

In the above description, it has been described that the manufacturing method according to the present embodiment is applied to manufacture of a TFT array substrate for a display device, such as an organic EL display or a crystal display. However, the method can be applied to manufacture of a TFT array substrate for other display devices. Furthermore, the manufacturing method according to the present embodiment can be used for other TFT array substrates except for a display device. For example, the semiconductor device according to the present embodiment may be used for a TFT array substrate for a flat panel detector such as an X-ray image sensor. It is possible to manufacture a TFT array substrate having a uniform semiconductor layer characteristic with high productivity.

(Determination Method of Optimized Energy Density)

Figure 25:
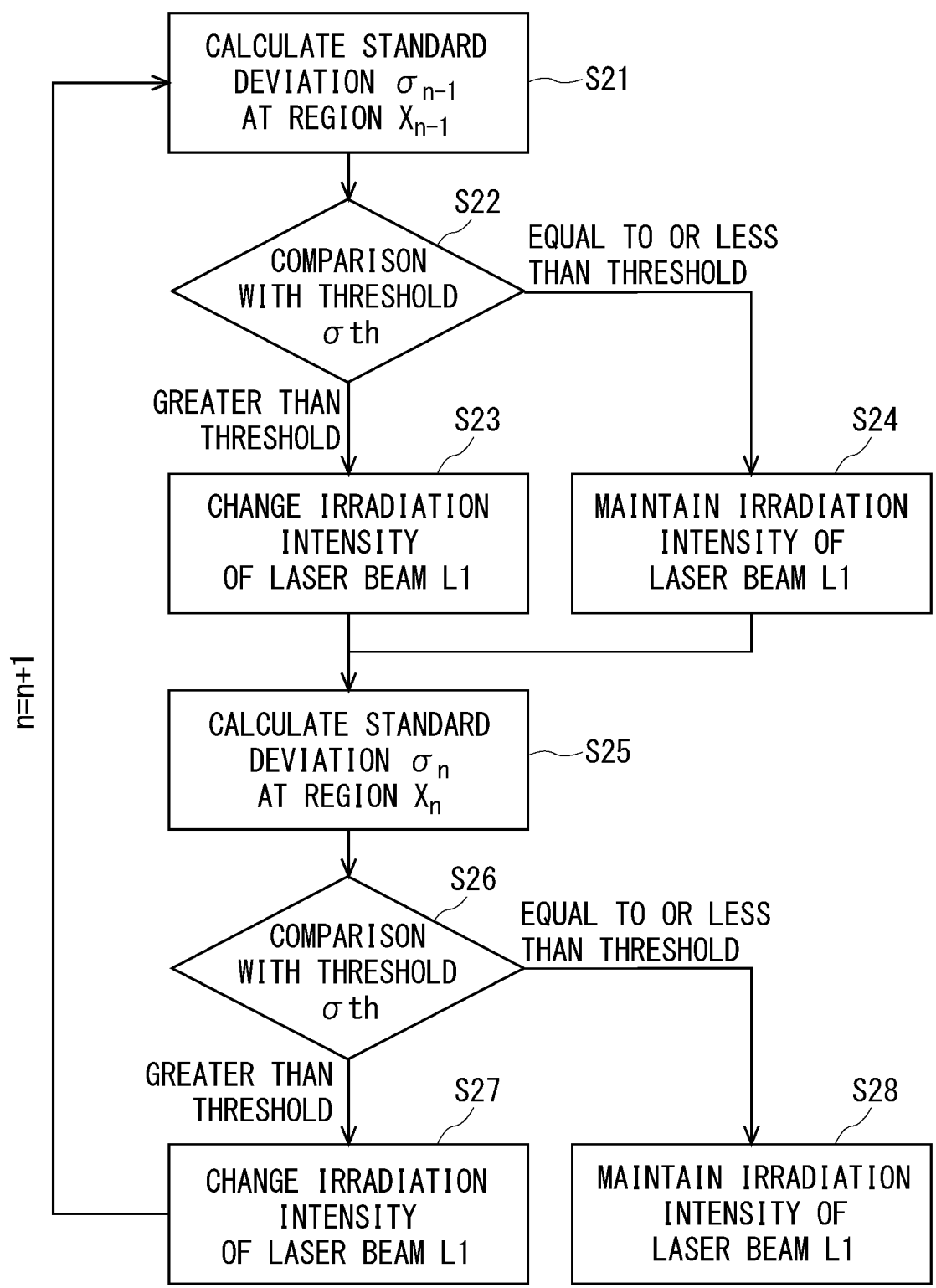
FIG. 25 is a flowchart showing a method for determining the optimized energy density of a laser beam in an inspection method according to the present embodiment.
Figure 26:
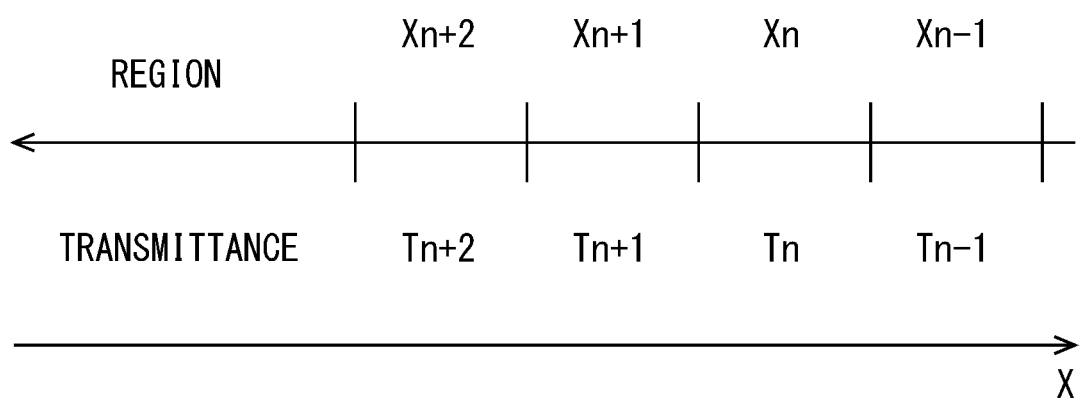
FIG. 26 is a diagram for explaining the region of the substrate in the flowchart shown in FIG. 25.

With reference to FIGS. 25 and 26, a method for determining an optimized energy density (OED) of the laser beam L1 with which a substrate is to be irradiated is described. FIG. 25 is a flowchart showing a method for determining the OED. FIG. 26 is a schematic diagram for explaining regions of a substrate in the method for determining the OED.

Here, the substrate 100 is divided into a plurality of regions in the X direction. As shown in FIG. 26, the divided regions are referred to as a region Xn−1, a region Xn, a region Xn+1, a region Xn+2, and the like. Note that, the substrate 100 is irradiated with the laser beam L1 and the probe beam L2 in the order of the region Xn−1, the region Xn, the region Xn+1, and the region Xn+2. Thus, after the transmittance at the region Xn−1 is measured, the transmittance at the region Xn is measured.

At the region Xn−1, the region Xn, the region Xn+1, and the region Xn+2, the measured transmittances are respectively referred to as a transmittance Tn−1, a transmittance Tn, a transmittance Tn+1, and a transmittance Tn+2. At each region, a plurality of detection values of the transmittance is acquired. For example, the transmittance Tn contains a plurality of detection values. Then, the standard deviation of the detection values of the transmittance Tn−1 is referred to as a standard deviation σn−1. The standard deviations of the detection values of the transmittance Tn, the transmittance Tn+1, and the transmittance Tn+2 are respectively referred to as a standard deviation σn, a standard deviation σn+1, and a standard deviation σn+2.

First, the processing apparatus 26 calculates the standard deviation σn−1 at the region Xn−1 (S21). Then, the processing apparatus 26 compares the standard deviation σn−1 with a threshold σth of the standard deviation (S22). When the standard deviation σn−1 is greater than the threshold σth, the irradiation intensity of the laser beam L1 (energy density) is changed (S23). That is, a laser beam source 11 increases or lowers the output. When the standard deviation σn−1 is equal to or less than the threshold σth, the irradiation intensity of the laser beam L1 is maintained (S24).

Next, the processing apparatus 26 calculates the standard deviation σn at the region Xn (S25). Then, the processing apparatus 26 compares the standard deviation σn with the threshold σth of the standard deviation (S26). When the standard deviation σn is greater than the threshold σth, the irradiation intensity of the laser beam L1 is changed (S27). That is, the laser beam source 11 increases or lowers the output. The output of a probe beam source 21 is determined to be increased or lowered in S27 based on the comparison result of the standard deviation σn with the standard deviation σn−1t. Then, the calculation n=n+1 is performed, that is, n is incremented, and the processing from S21 is consecutively performed. When the standard deviation σn is equal to or less than the threshold σth, the irradiation intensity of the laser beam L1 is maintained (S28).

It is thereby possible to determine the OED of the laser beam L1. In addition, while the substrate 100 is being irradiated with the laser beam L1, the photodetector 25 detects the probe beam L3. Thus, it is possible to optimize the energy density of the laser beam L1 in real time. That is, when the standard deviation of the transmittance is greater than the threshold σth, the laser beam source 11 changes the irradiation intensity of the laser beam L1. Accordingly, it is possible to reduce the standard deviation of the transmittance at the next region. Thus, it is possible to form a high-quality polysilicon film.

Third Embodiment

Figure 27:
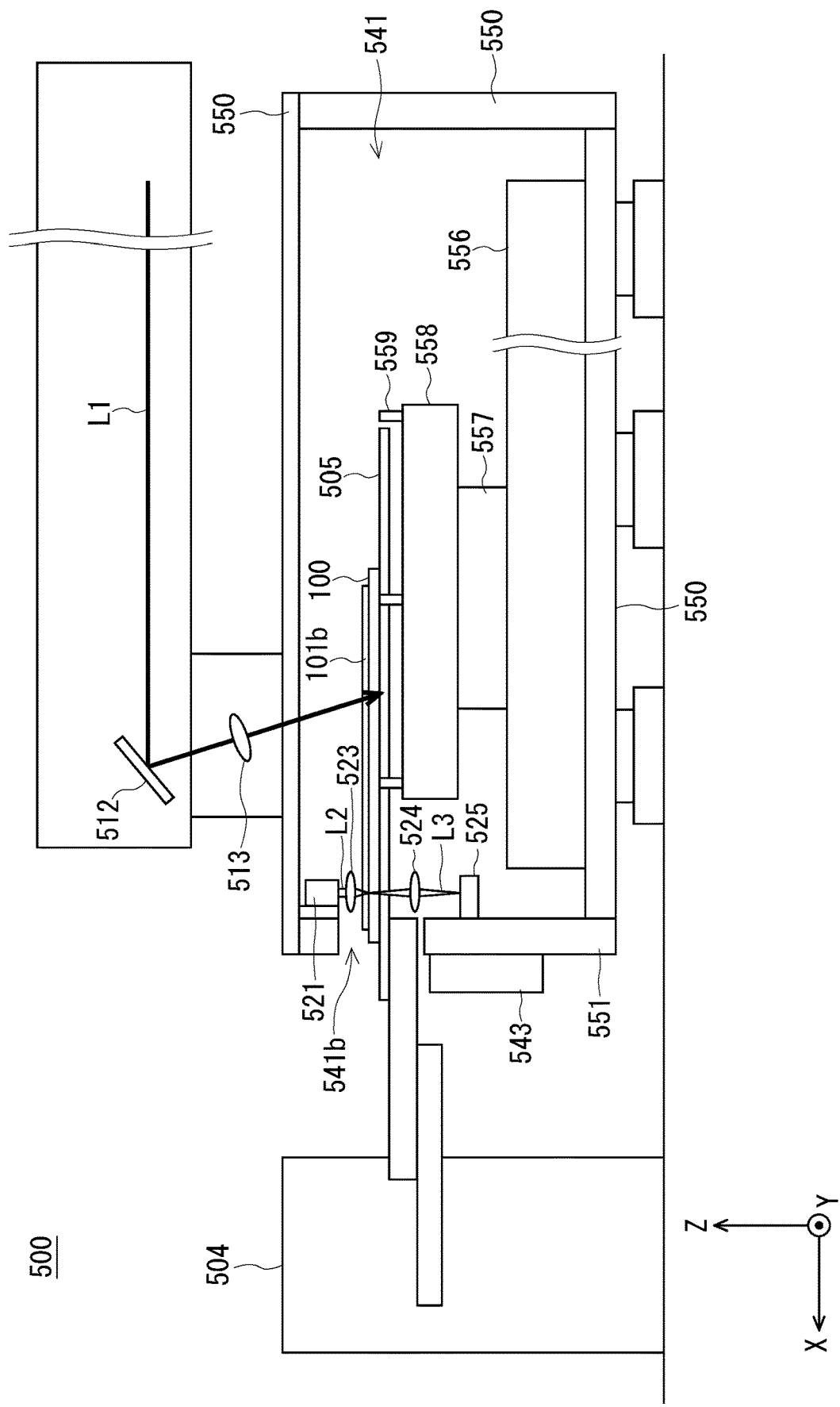
FIG. 27 is a side view schematically showing the configuration of the ELA apparatus according to a third embodiment.
Figure 28:
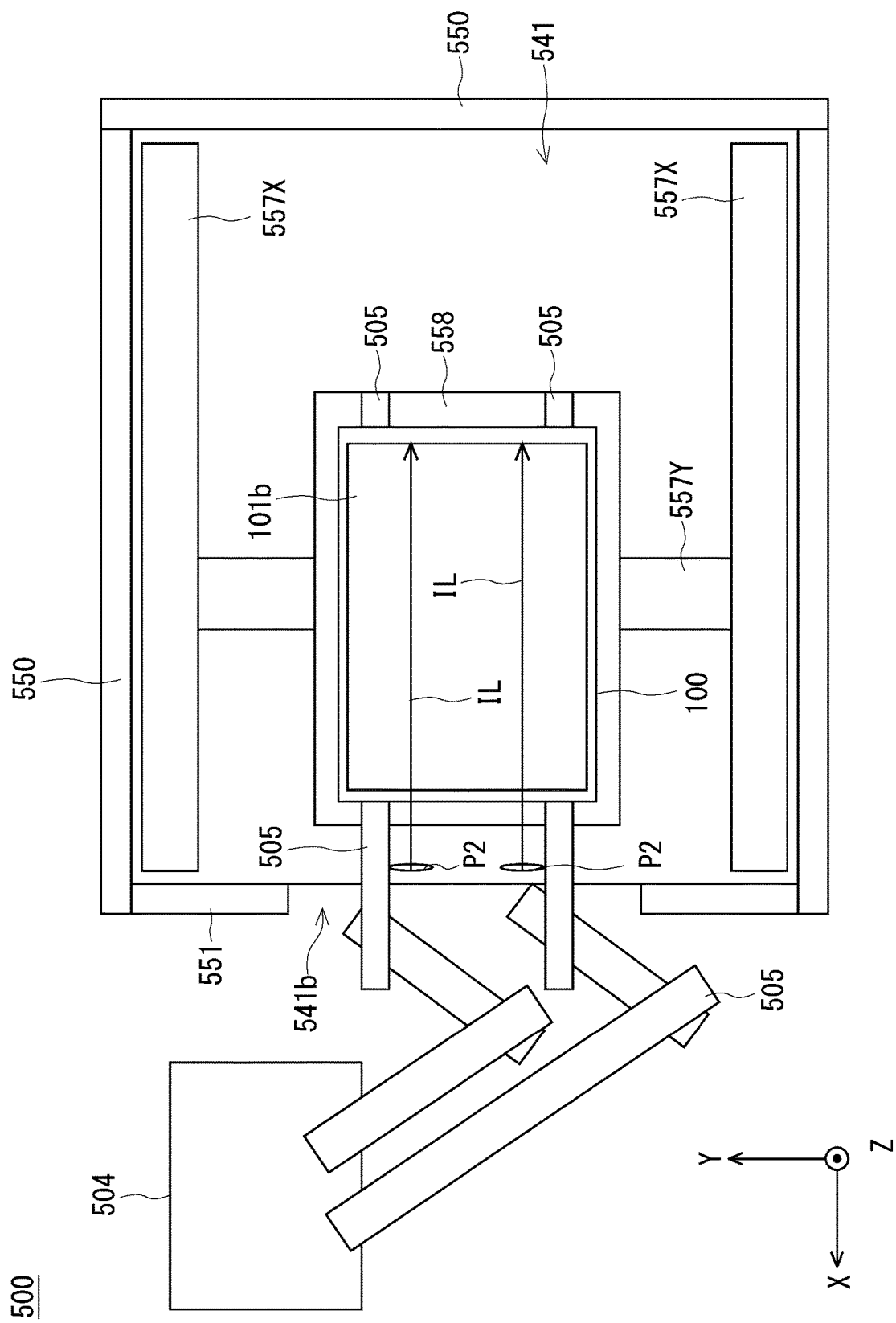
FIG. 28 is a plan view schematically showing a configuration of an ELA apparatus according to the third embodiment.

An ELA apparatus 500 according to a third embodiment is described with reference to FIGS. 27 and 28. FIG. 27 is a side view schematically showing a configuration of the ELA apparatus 500, and FIG. 28 is a plan view. As shown in FIG. 27, the ELA apparatus 500 includes a mirror 512, a projection lens 513, a probe beam source 521, a lens 523, a condenser lens 524, a photodetector 525, a door valve 543, a chamber 550, a surface plate 556, a drive mechanism 557, a suction stage 558, and a pusher pin 559.

In the present embodiment, the arrangement of the optical system for a probe beam, specifically, the arrangement of the probe beam source 521 and the photodetector 525 is different from that in the first and second embodiments. When a conveying robot 504 carries a substrate 100 out of the ELA apparatus 500, an inspection with a probe beam is performed. That is, after annealing treatment with a laser beam L1 is finished, an inspection with a probe beam L2 is performed. In addition, the suction stage 558 instead of the gas-floating unit 43 described in the second embodiment holds the substrate 100 in the present embodiment. The configuration and processing except for these points are similar to the ELA apparatus 500 in the first and second embodiments, and the description is omitted. For example, the optical system for irradiating the substrate 100 with the laser beam L1 is similar to that in the first embodiment. In addition, the inspection method with a probe beam is also similar to that in the first and second embodiments, and the description is omitted.

The ELA apparatus 500 includes a treatment chamber 550 surrounding a treatment room 541. The inside of the treatment chamber 550 is the treatment room 541. The treatment room 541 is in inert gas atmosphere, for example, nitrogen gas or the like. A carrying-out port 541b is provided at a side wall 551 of the treatment chamber 550. The carrying-out port 541b is provided at the end portion of the treatment chamber 550 at the +X side. Then, the conveying robot 504 is disposed outside the treatment chamber 550. The conveying robot 504 includes a robot hand 505 capable of entering the treatment room 541 through the carrying-out port 541b.

The conveying robot 504 carries the substrate 100 at a carrying-out position out through the carrying-out port 541b. That is, the robot hand 505 enters the treatment room 541 from the carrying-out port 541b and takes out the substrate 100 subjected to the treatment from the treatment room 541. As shown in FIG. 28, the robot hand 505 moves the substrate 100 in the +X direction, and the substrate 100 is carried out of the treatment room 541 through the carrying-out port 541b. The conveying robot 504 carries the carried-out substrate 100 in a cassette.

Note that, the carrying-out port 541b may be used as a carrying-in port. That is, the conveying robot 504 may carry the substrate 100 before the treatment through the carrying-out port 541b. Alternatively, a carrying-in port separately from the carrying-out port 541b may be provided to the treatment chamber 550. The carrying-out port 541b is provided with the door valve 543. The door valve 543 is opened at the time of carrying the substrate 100 out or the like, and the door valve 543 is closed at the time of the irradiation with the laser beam L1.

The surface plate 556, the drive mechanism 557, and the suction stage 558 are provided in the treatment room 541. The surface plate 556 is fixed in the treatment chamber 550. The suction stage 558 is attached to the surface plate 556 through the drive mechanism 557. As shown in FIG. 28, the drive mechanism 557 includes an X shaft 557X that moves the suction stage 558 in the X direction and a shaft 557Y that moves the suction stage 558 in the Y direction. As described in the first embodiment, the laser beam L1 is a line beam having its longitudinal direction in the Y direction on the substrate 100. The drive mechanism 557 moves the suction stage 558 in the X direction. Accordingly, while the suction stage 558 is moving the substrate 100 along a conveying path, the substrate 100 is irradiated with the laser beam L1. In addition, the drive mechanism 557 may have a θ shaft that rotates the suction stage 558 about the Z axis.

The suction stage 558 sucks and holds the substrate 100. The suction stage 558 is provided with the pusher pin 559 for carrying the substrate 100 in and out. The pusher pin 559 is provided so as to be raised and lowered. When the substrate 100 is carried in or out, the pusher pin 559 is raised to transfer the substrate 100 to the robot hand 505.

Specifically, when the pusher pin 559 is raised while the substrate 100 is on the suction stage 558, a gap is generated between the substrate 100 and the suction stage 558. Then, the robot hand 505 enter the gap between the substrate 100 and the suction stage 558. When the pusher pin 559 is lowered while the robot hand 505 is being under the substrate 100, the robot hand 505 holds the substrate 100.

Alternatively, the robot hand 505 conveys the substrate 100 onto the suction stage 558 while the pusher pin 559 is being lowered. Then, when the pusher pin 559 is raised, the pusher pin 559 holds the substrate 100. When the pusher pin 559 is lowered while the substrate 100 is being placed on the pusher pin 559, the substrate 100 is placed onto the suction stage 558. Accordingly, the suction stage 558 becomes ready to suck the substrate 100. The suction stage 558 sucks the substrate 100 at the time of the irradiation with the laser beam L1. When the irradiation with the laser beam L1 is finished, the suction stage 558 releases the suction.

The probe beam source 521, the lens 523, the condenser lens 524, and the photodetector 525 are further provided in the treatment room 541. The probe beam source 521, the lens 523, the condenser lens 524, and the photodetector 525 are disposed in the vicinity of the side wall 551. For example, the probe beam source 521, the lens 523, the condenser lens 524, and the photodetector 525 are fixed on the surface at the treatment room 541 side of the side wall 551. For example, while the suction stage 558 is being stopped at the substrate carrying-out position (the endmost of the +X side), the probe beam source 521 emits the probe beam L2.

The probe beam L2 emitted from a probe beam source L2 is condensed by the lens 523 and enters the substrate 100. During the robot hand 505 conveys the substrate 100, a polysilicon film 101b is irradiated with the probe beam L2 outside the suction stage 558. A probe beam L3 transmitted through the substrate 100 is condensed by the condenser lens 524 on the photodetector 525. The photodetector 525 outputs detection signals to a processing apparatus (the illustration is omitted) as described above.

When the robot hand 505 carries the substrate 100 out through the carrying-out port 541b to the outside of the treatment room 541, an inspection with the probe beam L2 can be performed. The robot hand 505 carries the substrate 100 on the suction stage 558 out, and the irradiation position of the probe beam L2 is changed toward the +X direction. During the robot hand 505 carries the substrate 100 out, the substrate 100 passes between the lens 523 and the condenser lens 524. The probe beam L2 from the probe beam source 521 is condensed by the lens 523 on the substrate 100. The probe beam L2 forms an illumination region P2 outside the suction stage 558 (see FIG. 28). Note that, the illumination region P2 of the probe beam L2 has a linear shape extending in the Y direction, but may have a point-like shape.

The probe beam L3 having passed through the polysilicon film 101b of the substrate 100 is condensed by the condenser lens 524 on the photodetector 525. During the robot hand 505 carries the substrate 100 out, the photodetector 525 detects the probe beam L3. That is, the robot hand 505 moves the substrate 100 in the +X direction in order for the robot hand 505 to carry the substrate 100 out through the carrying-out port 541b. While the substrate 100 is being moved in the +X direction, the photodetector 525 detects the probe beam L3. It is thereby possible to measure the transmittance of the polysilicon film 101b of the substrate 100 in an inspection line IL as shown in FIG. 28. Note that, since the robot hand 505 moves the substrate 100 in the +X direction, the inspection line IL has a belt-like shape or a line shape having its longitudinal direction in the X direction.

The annealing laser beam L1 forms a linear irradiation region P1 having its longitudinal direction in the Y direction (see FIG. 3). On the other hand, the robot hand 505 moves the substrate 100 in the X direction. Thus, at the time of the inspection with a probe beam, the substrate 100 is scanned along the latitudinal direction of the irradiation region P1. It is thereby possible to properly evaluate shot unevenness.

Unlike the gas-floating unit, it can be difficult for the suction stage 558 to be provided with the optical path of a probe beam. Although this suction stage 558 is used, it is possible for the photodetector 525 to detect the probe beam L3 transmitted through the substrate 100 with the configuration in the present embodiment. Thus, it is possible to properly inspect the substrate 100. When the substrate 100 is determined to be abnormal based on the standard deviation or the average value of the detection values, the substrate 100 is carried in the ELA apparatus 500 and re-irradiated with the laser beam L1. For example, the portion having shot unevenness or the entire substrate 100 may be re-irradiated with the laser beam L1. Accordingly, it is possible to improve the yield.

The lens 523 forms the illumination region P2 of the probe beam L2 at the X position between the carrying-out port 541b and the suction stage 558. In the substrate conveying process by the robot hand 505, the substrate 100 is moved for a longer distance than the substrate 100. In the X direction in which the substrate 100 is conveyed, the inspection line IL is formed over the entire substrate 100. By evaluating the transmittance in the inspection line IL, it is possible to evaluate the crystalline state of the polysilicon film 101b. In addition, since the inspection can be performed in the substrate conveying process, it is unnecessary to convey the substrate 100 only for performing the inspection. Accordingly, it is possible to prevent the increase in tact time. Furthermore, the probe beam source 521, the lens 523, the condenser lens 524, and the photodetector 525 are attached in the vicinity of the side wall 551. Thus, it is possible to prevent a space for providing an optical system from increasing.

In addition, two illumination regions P2 of the probe beam L2 are formed on the substrate 100 as shown in FIG. 28 in the present embodiment. That is, the substrate 100 is irradiated simultaneously with the two probe beams L2 separated in the Y direction. Accordingly, it is possible to simultaneously measure the transmittances of the two portions of the substrate 100. It is thereby possible to more reliably perform evaluation.

For example, when particles are attached to a substrate, abnormal values indicating that the transmittance is greatly lowered can be detected at the points of particles. When such abnormal values are detected, the standard deviation of the detection values is greatly affected. However, it is difficult to determine whether the abnormal values are caused by particles or by the crystalline state. Thus, by irradiating the substrate with the two or more separated probe beams L2 as described in the present embodiment, it is possible to eliminate the influence of the abnormal values caused by particles. That is, when one abnormal value at the same X position is detected, the abnormal value is determined to be caused by particles, or when abnormal values are detected at two portions, the abnormal values are determined to be caused by shot unevenness. Thus, by eliminating abnormal values caused by particles to calculate the standard deviation, it is possible to more reliably perform evaluation.

Note that, it has been described that the robot hand 505 conveys the substrate 100 along the latitudinal direction of the irradiation region P1 of the laser beam L1 in the above description, but the latitudinal direction of the irradiation region P1 of the laser beam L1 may not be the same as the conveying direction of the robot hand 505. For example, before the irradiation with the laser beam L1, the suction stage 558 can rotate the substrate 100 about the Z axis (in the θ direction) by 90°. Alternatively, the robot hand 505 can move the substrate 100 in the Y direction according to the position of a carrying-out port 541. In such cases, the latitudinal direction of the irradiation region P1 of the laser beam L1 is orthogonal to the conveying direction of the robot hand 505. That is, the inspection line IL is parallel to the longitudinal direction of the irradiation region P1 of the laser beam L1.

In this case, scanning unevenness instead of shot unevenness of the laser beam L1 can be evaluated. Note that, scanning unevenness is not caused by laser but by an optical system and also referred to as optics unevenness. Specifically, if particles or the like are attached to the optical element included in the optical system of the laser beam L1, a shadow appears on a part of the irradiation region P1. Since the detection light amount is lowered at the position where the shadow appears, an abnormal value is detected. The shadow appears at the same position in the irradiation region P1, abnormal values are detected along the line parallel to the latitudinal direction of the irradiation region P1. Thus, abnormal values occur in the line at the same position regardless of the substrate 100, which indicates that there is scanning unevenness. Note that, in order to both evaluate scanning unevenness and shot unevenness, it is only required to evaluate a substrate irradiated with a laser at the suction stage set to 0° and the substrate irradiated with a laser at the suction stage rotated by 90°.

Note that, when the robot hand 505 carries the substrate 100 out, the substrate 100 can be bent and moved up and down. When the substrate 100 is moved up and down, the size of the illumination region P2 on the substrate 100 is changed. That is, the illumination region P2 has the smallest size when the focal point of the probe beam L2 by the lens 523 is on the substrate 100, but the size of the illumination region P2 becomes larger as the substrate 100 is separated farther from the focal point.

Figure 29:
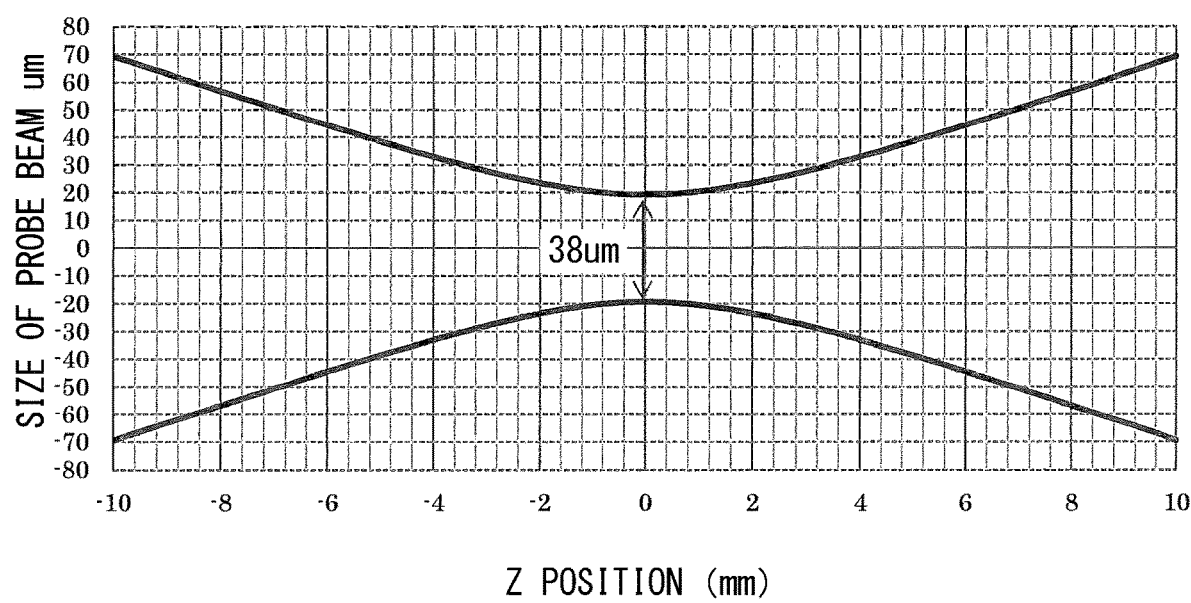
FIG. 29 is a diagram showing the size of a probe beam according to a Z position.

FIG. 29 shows the size of the probe beam L2 at the Z position when the focal point at the Z position is set as 0. FIG. 29 shows a simulation result when the probe beam L2 having the wavelength of 405 nm and the size of 4 mm is condensed by the lens 523 of 300 mm. The horizontal axis indicates a Z position, and the vertical axis indicates the size of the probe beam L2. In FIG. 29, the size of the probe beam L2 is about 38 µm at the focal point. When the Z position is shifted by ±2 mm, the size of the probe beam L2 is 47 µm, and this does not matter practically. That is, if the probe beam L2 having the size of 47 µm passes though the substrate 100, the photodetector 525 detects the probe beam L3 transmitted through the substrate 100 by the condenser lens 524.

(Optical System for Probe Beam)

Figure 30:
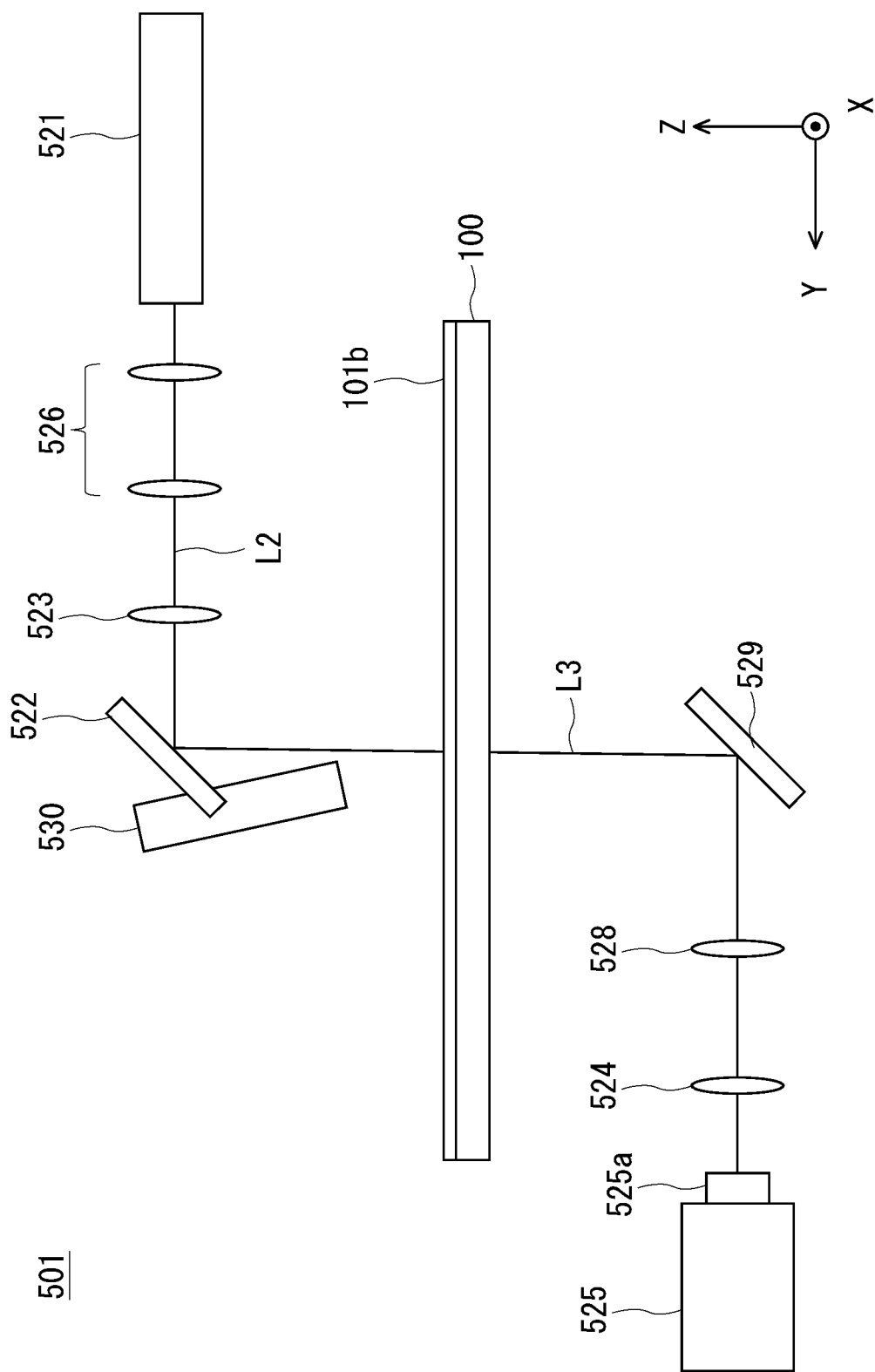
FIG. 30 is a diagram showing an example of an optical system for a probe beam in an ELA apparatus.
Figure 31:
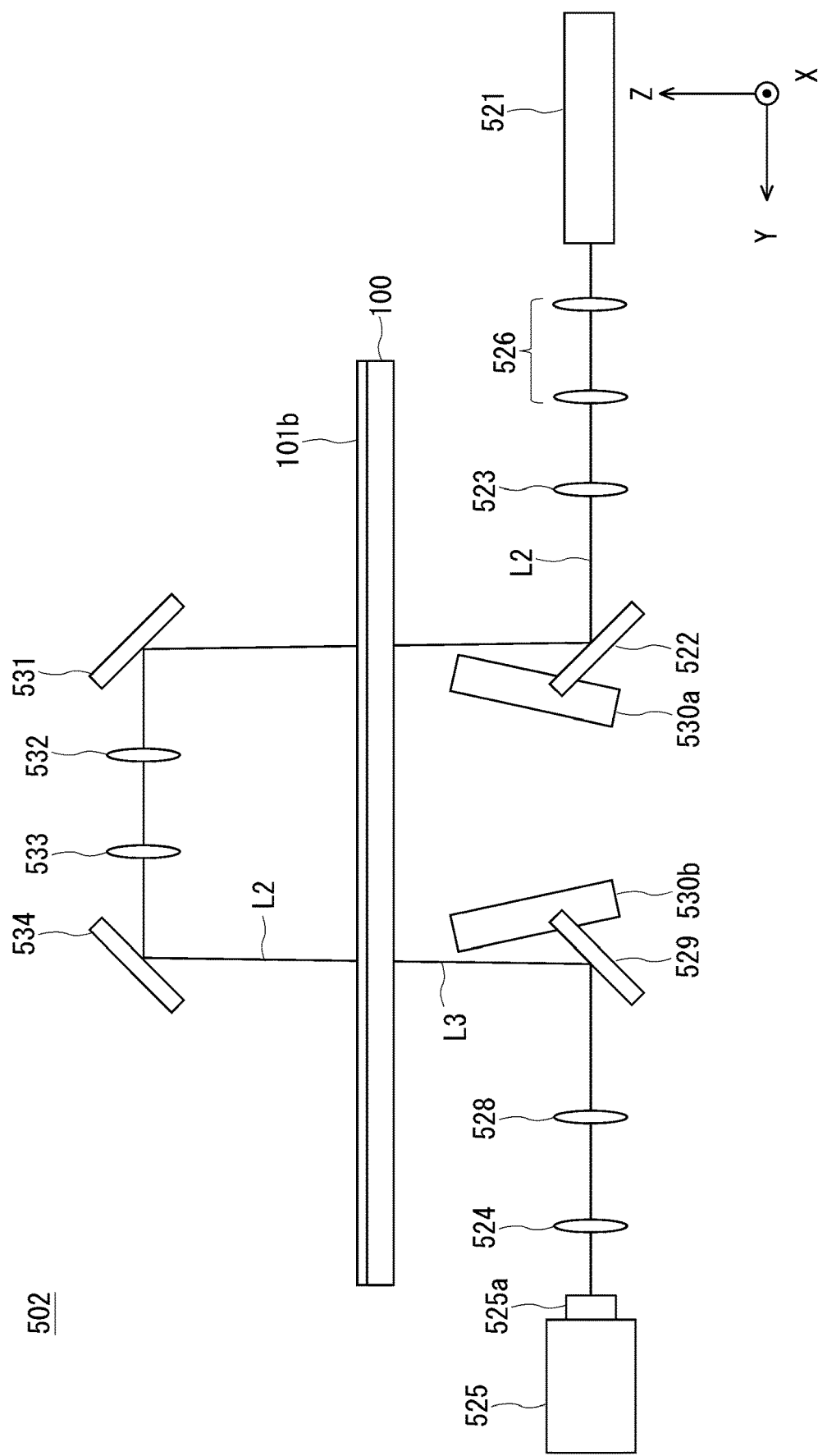
FIG. 31 is a diagram showing an example of an optical system for a probe beam in an ELA apparatus.
Figure 32:
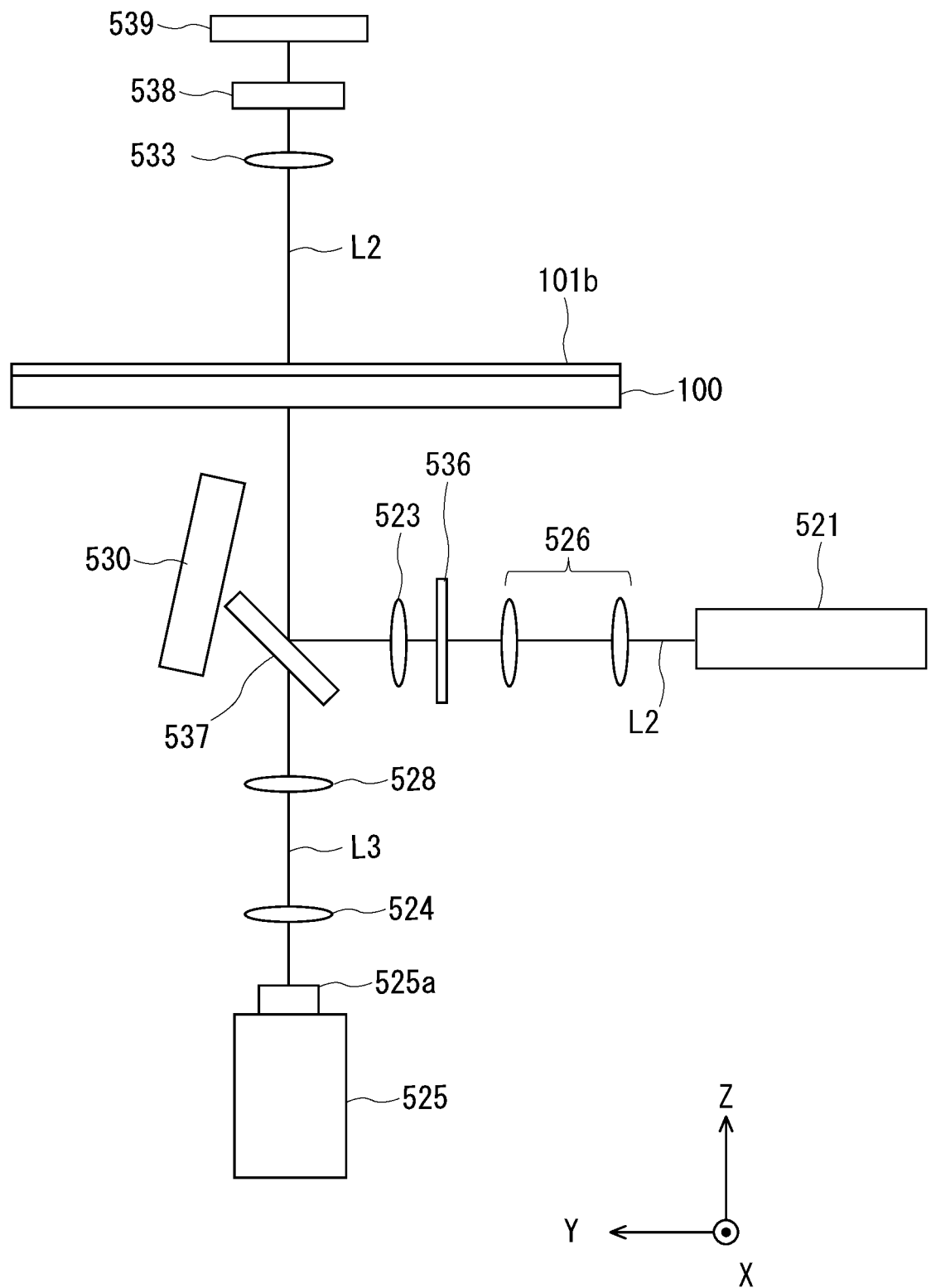
FIG. 32 is a diagram showing an example of an optical system for a probe beam in an ELA apparatus.

Next, a configuration of an optical system for a probe beam in an ELA apparatus according to a third embodiment is described. FIGS. 30 to 32 are diagrams showing configurations of optical systems for the probe beam L2. FIGS. 30 to 32 each show an optical system that irradiates the substrate 100 with the probe beam L2 and detects the probe beam L3 transmitted through the substrate 100.

<Optical System 501>

FIG. 30 is a schematic diagram showing an example of an optical system (referred to as an optical system 501). The optical system 501 includes a probe beam source 521, a one-side expander 526, a lens 523, a mirror 522, a mirror 529, a collimation lens 528, a condenser lens 524, and a photodetector 525.

The probe beam source 521 generates a probe beam L2 having a wavelength of 405 nm. The probe beam L2 from the probe beam source 521 enters the one-side expander 526. The one-side expander 526 has two lenses and expands the beam diameter in the Y direction. Note that, the conveying direction of the substrate 100 by the robot hand 505 is the X direction. The substrate 100 is irradiated with the probe beam L2 from the one-side expander 526 through the lens 523 and the mirror 522. Note that, the lens 523 is a cylindrical lens and condenses the probe beam L2 in the X direction. Thus, the probe beam L2 forms, on the substrate 100, a linear illumination region having its longitudinal direction in the Y direction and its latitudinal direction in the X direction.

The probe beam L3 transmitted through the substrate 100 is reflected by the mirror 529 and enters the collimation lens 528. The collimation lens 528 turns the probe beam L3 into a parallel luminous flux. The probe beam L3 having passed through the collimation lens 528 enters the condenser lens 524. The condenser lens 524 condenses the probe beam L3 on the light-receiving surface of the photodetector 525. The photodetector 525 is provided with a band-pass filter 525a. The band-pass filter 525a transmits light having a wavelength of 405 nm. Accordingly, it is possible to prevent stray light having a wavelength other than the wavelength of the probe beam from entering the photodetector 525.

With the optical system 501, it is possible to properly evaluate the crystalline state. In addition, the optical system 501 may be provided with a camera 530 that confirms the focal point of the lens 523. A camera 30 captures an image of the illumination region of the probe beam L2 and its surroundings. The focal point can be adjusted based on the image by the camera 530. The camera 530 may be provided only at the time of installing the optical system 501.

<Optical System 502>

FIG. 31 is a schematic diagram showing another example of an optical system for a probe beam (referred to as an optical system 502). The optical system 502 has a configuration for detecting a probe beam having passed through the substrate 100 twice. The optical system 502 includes a probe beam source 521, a one-side expander 526, a lens 523, a mirror 522, a mirror 531, a collimation lens 532, a condenser lens 533, a mirror 534, a mirror 529, a collimation lens 528, a condenser lens 524, and a photodetector 525.

The probe beam source 521 generates a probe beam L2 having a wavelength of 405 nm. The probe beam L2 from the probe beam source 521 enters the one-side expander 526. The one-side expander 526 has two lenses and expands the beam diameter in the Y direction. The substrate 100 is irradiated with the probe beam L2 from the one-side expander 526 through the lens 523 and the mirror 522. Note that, the lens 523 is a cylindrical lens and condenses the probe beam L2 in the X direction. Thus, the probe beam L2 reflected by the mirror 522 forms, on the substrate 100, a linear illumination region having its longitudinal direction in the Y direction and its latitudinal direction in the X direction.

The probe beam L2 transmitted through the substrate 100 is reflected by the mirror 531 and enters the collimation lens 532. The collimation lens 532 turns the probe beam L2 into a parallel luminous flux. The probe beam L2 from the collimation lens 532 enters the substrate 100 through the condenser lens 533 and the mirror 534. Note that, the condenser lens 533 is a cylindrical lens and condenses the probe beam L2 in the X direction. Thus, the probe beam L2 reflected by the mirror 534 forms, on the substrate 100, a linear illumination region having its longitudinal direction in the Y direction and its latitudinal direction in the X direction.

The probe beam L3 transmitted through the substrate 100 is reflected by the mirror 529 and enters the collimation lens 528. The collimation lens 528 turns the probe beam L3 into a parallel luminous flux. The probe beam L3 having passed through the collimation lens 528 enters the condenser lens 524. The condenser lens 524 condenses the probe beam L3 on the light-receiving surface of the photodetector 525. The photodetector 525 is provided with a band-pass filter 525a. The band-pass filter 525a transmits light having a wavelength of 405 nm. Accordingly, it is possible to stray light having a wavelength other than the wavelength of the probe beam from entering the photodetector 525.

In this manner, the photodetector 525 detects the probe beam L3 having passed through the polysilicon film 101b twice in the optical system 502. Accordingly, it is possible to emphasize transmittance unevenness. Thus, it is possible to properly evaluate the crystalline state.

The focal point by the lens 523 is shifted from the focal point by the condenser lens 533 in the Y direction on the substrate 100. That is, when the conveying direction by the robot hand 505 is the X direction, the probe beam L2 has passed through the substrate 100 twice at different Y positions and at the same X position. Accordingly, since shot unevenness is emphasized, it is possible to properly evaluate the crystalline state. Naturally, the optical system 502 may be configured so that a probe beam passes through the polysilicon film 101b three times or more. For example, a mirror and a lens can be added in order for a probe beam to pass through the polysilicon film 101b three times or more.

The first and second positions where the probe beam L2 passes through the substrate 100 are separated in the Y direction. Thus, it is possible to reduce the influence of particles. For example, if a particle is attached to the first passing position, the particle is not attached to the second passing position. Thus, it is possible to reduce the influence of particles on lowering the transmittance. Accordingly, it is possible to properly evaluate the crystalline state.

The optical system 502 may be provided with cameras 530a and 530b that respectively confirm the focal points of the lens 523 and the condenser lens 533. The cameras 530a and 530b each capture an image of the illumination region of the probe beam L2 and its surroundings. The focal points can be adjusted based on the images by the cameras 530a and 530b. The cameras 530a and 530b may be provided only at the time of installing the optical system 502.

<Optical System 503>

FIG. 32 is a schematic diagram showing another example of an optical system for a probe beam (referred to as an optical system 503). The optical system 503 has a configuration for detecting a probe beam having passed through the substrate 100 twice. In addition, the probe beam L2 passes through the substrate 100 at the same position twice in an optical system 303. The optical system 503 includes a probe beam source 521, a one-side expander 526, a polarizing plate 536, a lens 523, a beam splitter 537, a condenser lens 533, a quarter-wavelength plate 538, a mirror 539, a collimation lens 528, a condenser lens 524, and a photodetector 525.

The probe beam source 521 generates a probe beam L2 having a wavelength of 405 nm. The probe beam L2 from the probe beam source 521 enters the one-side expander 526. The one-side expander 526 expands the beam diameter in the Y direction. The substrate 100 is irradiated with the probe beam L2 from the one-side expander 526 through the polarizing plate 536, the lens 523, and the beam splitter 537. The polarizing plate 536 turns the probe beam L2 into linearly polarized light along a first direction. The beam splitter 537 is, for example, a polarizing beam splitter, reflects the linearly polarized light along the first direction, and transmits linearly polarized light along a second direction orthogonal to the first direction. Thus, the beam splitter 537 reflects the probe beam L2 toward the substrate 100.

The lens 523 is a cylindrical lens and condenses the probe beam L2 in the X direction. Accordingly, the probe beam L2 forms, on the substrate 100, a linear illumination region having its longitudinal direction in the Y direction and its latitudinal direction in the X direction.

The probe beam L2 transmitted through the substrate 100 enters the condenser lens 533 which is a cylindrical lens. The condenser lens 533 functions as a collimation lens that turns the probe beam L2 from the substrate 100 into a parallel luminous flux. The probe beam L2 from the condenser lens 533 is reflected by the mirror 539 through the quarter-wavelength plate 538. The mirror 539 is a total reflection mirror and makes the probe beam L2 transmitted through the quarter-wavelength plate 538 enter the quarter-wavelength plate 538 again. Since the probe beam L2 passed through the quarter-wavelength plate 538 twice, the linearly polarized light is rotated by 90°. Thus, the probe beam L2 directed from the quarter-wavelength plate 538 toward the substrate 100 is linearly polarized light along the second direction.

The probe beam L2 having passed through the quarter-wavelength plate 538 twice is condensed by the condenser lens 533 on the substrate 100. As described above, the probe beam L2 forms, on the substrate 100, a linear illumination region having its longitudinal direction in the Y direction and its latitudinal direction in the X direction. The probe beam L3 transmitted through the substrate 100 enters the beam splitter 537. As described above, the probe beam L3 is linearly polarized light along the second direction and transmitted through the beam splitter 537. The probe beam L3 transmitted through the beam splitter 537 enters the collimation lens 528.

The collimation lens 528 turns the probe beam L3 into a parallel luminous flux. The probe beam L3 having passed through the collimation lens 528 enters the condenser lens 524. The condenser lens 524 condenses the probe beam L3 on the light-receiving surface of the photodetector 525. The photodetector 525 is provided with a band-pass filter 525a. The band-pass filter 525a transmits light having a wavelength of 405 nm. Accordingly, it is possible to stray light having a wavelength other than the wavelength of the probe beam from entering the photodetector 525.

In this manner, the photodetector 525 detects the probe beam L3 having passed through the polysilicon film 101b twice in the optical system 503. Accordingly, it is possible to emphasize transmittance unevenness. In addition, the focal point by the lens 523 and the focal point by the condenser lens 533 are at the same position on the substrate 100. Accordingly, it is possible to emphasize shot unevenness and to more properly evaluate the crystalline state.

Note that, the probe beam L2 has passed through the substrate 100 at the same position in the optical system 503. The optical system 503 may be provided with a camera 530 that confirms the focal points of the lens 523 and the condenser lens 533. The camera 530 captures an image of the illumination region of the probe beam L2 and its surroundings. The focal points can be adjusted based on the image by the camera 530. The camera 530 may be provided only at the time of installing the optical system 503.

Figure 33:
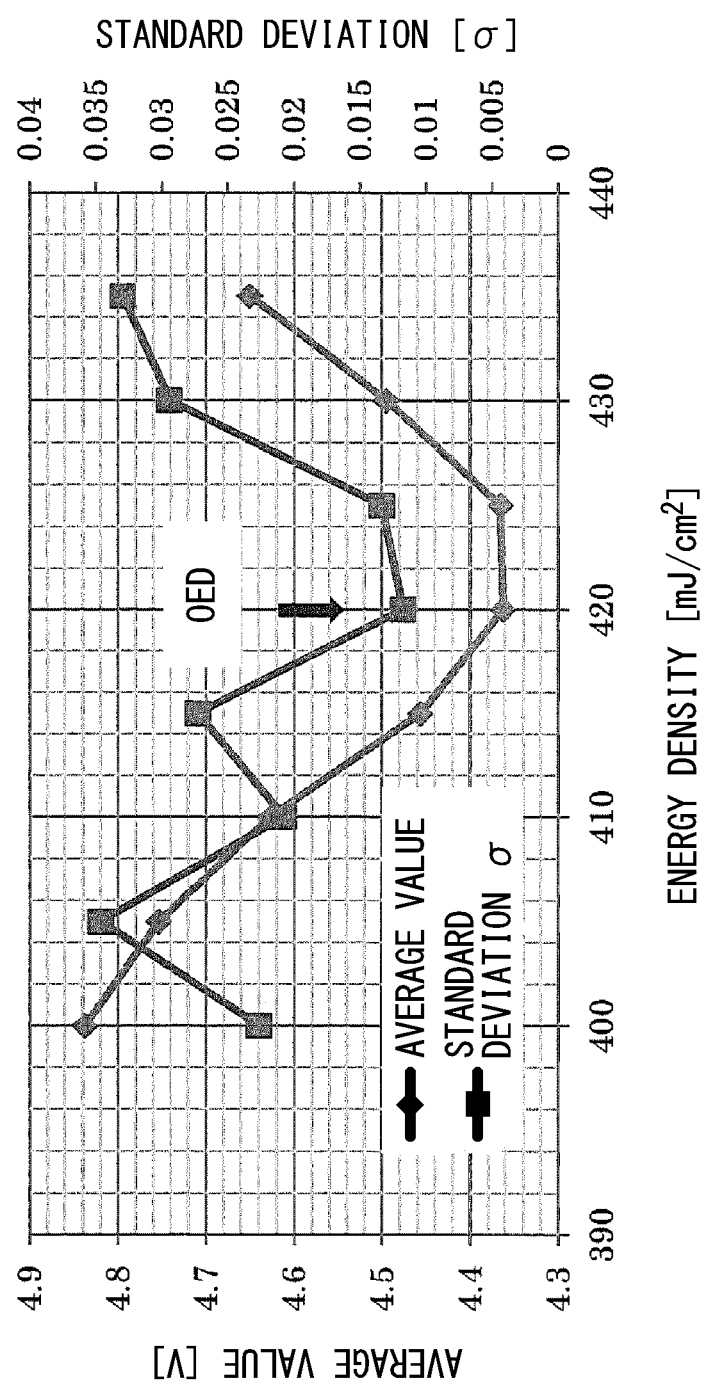
FIG. 33 is a graph showing a measurement result of a probe beam.

FIG. 33 is a graph showing the average value and the standard deviation of the detection signals acquired by the photodetector 52. FIG. 33 shows a measurement result when the energy density is changed in the range from 400 to 435 mJ/cm$^2$ and at a pitch of 5 mJ/cm$^2$. When the energy density is 420 mJ/cm$^2$ and 425 mJ/cm$^2$, the average values of the detection signals are low. Thus, the OED is to be either 420 mJ/cm$^2$ or 425 mJ/cm$^2$.

However, the average values at 420 mJ/cm$^2$ and 425 mJ/cm$^2$ are nearly the same, and it is difficult to obtain the OED from the average values. On the other hand, the standard deviation at 420 mJ/cm$^2$ is less than the standard deviation at 425 mJ/cm$^2$. Thus, the OED can be set to 420 mJ/cm$^2$. In this manner, by using the average values and the standard deviations of the detection values, it is possible to properly determine the OED.

The present invention is not limited to the above-described embodiments, various modifications can be made without departing from the spirit and scope of the present invention.

This application is based upon and claims the benefit of priority from Japanese patent application No. 2016-163693, filed on Aug. 24, 2016 and Japanese patent application No. 2017-112516, filed on Jun. 7, 2017, the disclosure of which is incorporated herein in its entirety by reference.

REFERENCE SIGNS LIST

1 Laser annealing apparatus
11 Laser beam source
12 Mirror
13 Projection lens
21 Probe beam source
22 Mirror
23 Lens
24 Condenser lens
25 Photodetector
26 Treatment apparatus
100 Substrate
101 Silicon film
300 Organic EL display
310 Substrate
311 TFT layer
311a TFT
312 Organic layer
312a Organic EL light emitting device
312b Partition wall
313 Color filter layer
313a Color filter (CF)
314 Sealing substrate
401 Glass substrate
402 Gate electrode
403 Gate insulating film
404 Amorphous silicon film
405 Polysilicon film
406 Interlayer insulating film
407a Source electrode
407b Drain electrode
408 Planarization film
409 Pixel electrode
410 TFT
PX Pixel

The invention claimed is:

1. An inspection method of a substrate with a crystallized film, the method comprising the steps of:
   (A) irradiating an amorphous film over the substrate with a laser beam to crystallize the amorphous film and to form the crystallized film;
   (B) irradiating the crystallized film with a probe beam;
   (C) detecting, by a photodetector, the probe beam transmitted through the crystallized film;
   (D) changing an irradiation position of the probe beam onto the crystallized film to acquire a plurality of detection values of a detection signal from the photodetector; and
   (E) determining, based on a standard deviation of the plurality of detection values, a crystalline state of the crystallized film, wherein the laser beam passes through a projection lens and forms a linear irradiation region on the amorphous film by the projection lens, and the photodetector detects the probe beam having passes through the projection lens.

2. The inspection method according to claim 1, wherein the step (E) comprises:

comparing the standard deviation with a threshold; and determining the substrate to be non-defective when the standard deviation is less than the threshold or determining the substrate to be defective when the standard deviation is equal to or greater than the threshold.

3. The inspection method according to claim 1, wherein the step (E) further comprises determining the crystalline state based on an average value of the plurality of detection values.

4. The inspection method according to claim 1, wherein the probe beam forms a linear illumination region on the crystallized film, and the probe beam transmitted through the crystallized film is condensed on the photodetector by a condenser lens.

5. The inspection method according to claim 1, wherein the step (D) comprises conveying the substrate to change an irradiation position of the laser beam and the irradiation position of the probe beam while the substrate is being irradiated simultaneously with the laser beam and the probe beam.

6. The inspection method according to claim 1, wherein the step (A) comprises irradiating the amorphous film with the laser beam while the substrate placed over a stage is being moved, the step (B) comprises irradiating the amorphous film with the probe beam outside the stage, and the step (D) comprises carrying the substrate on the stage out by a robot hand to change the irradiation position of the probe beam.

7. The inspection method according to claim 6, wherein the step (C) comprises detecting, by the photodetector, the probe beam having passed through the crystallized film twice or more.

8. A manufacturing method of a semiconductor device, the method comprising the steps of:

(a) forming an amorphous film over a substrate;

(b) irradiating the amorphous film with a laser beam to crystallize the amorphous film and to form a crystallized film;

(c) irradiating the crystallized film with a probe beam;

(d) detecting, by a photodetector, the probe beam transmitted through the crystallized film;

(e) changing an irradiation position of the probe beam onto the crystallized film to acquire a plurality of detection values of a detection signal output from the photodetector;

(f) determining, based on a standard deviation of the plurality of detection values, a crystalline state of the crystallized film; and (g) re-irradiating the crystallized film with the laser beam according to a determination result of the crystalline state, wherein the laser beam passes through a projection lens and forms a linear irradiation region on the amorphous film by the projection lens, and the photodetector detects the probe beam having passes through the projection lens.

9. The manufacturing method according to claim 8, wherein the step (f) comprises:

comparing the standard deviation with a threshold; and determining the substrate to be non-defective when the standard deviation is less than the threshold or determining the substrate to be defective when the standard deviation is equal to or greater than the threshold.

* * * * *